(12) United States Patent
Kouno et al.

(10) Patent No.: US 12,451,284 B2
(45) Date of Patent: Oct. 21, 2025

(54) MULTILAYER BOARD, ELECTRONIC DEVICE, AND MULTILAYER BOARD INSPECTION METHOD

(71) Applicant: Murata Manufacturing Co., Ltd., Nagaokakyo (JP)

(72) Inventors: Kiminori Kouno, Nagaokakyo (JP); Koji Kamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 778 days.

(21) Appl. No.: 17/750,430

(22) Filed: May 23, 2022

(65) Prior Publication Data

US 2022/0285082 A1    Sep. 8, 2022

Related U.S. Application Data

(63) Continuation of application No. PCT/JP2021/002270, filed on Jan. 22, 2021.

(30) Foreign Application Priority Data

Jan. 24, 2020   (JP) .................... 2020-009818

(51) Int. Cl.
   *H01F 5/00* (2006.01)
   *H01F 27/28* (2006.01)
   (Continued)

(52) U.S. Cl.
   CPC ....... *H01F 27/2804* (2013.01); *H01F 27/292* (2013.01); *H05K 1/0268* (2013.01);
   (Continued)

(58) Field of Classification Search
   CPC .................................................. H01F 27/2804
   (Continued)

(56) References Cited

U.S. PATENT DOCUMENTS

| 11,289,264 B2* | 3/2022 | Lim ................. H01F 27/292 |
| 2003/0151881 A1* | 8/2003 | Yue .................... H03H 7/42 |
| | | 361/268 |

(Continued)

FOREIGN PATENT DOCUMENTS

| JP | H097835 A | 1/1997 |
| JP | 2015004621 A | 1/2015 |

(Continued)

OTHER PUBLICATIONS

International Search Report in PCT/JP2021/002270, mailed Mar. 9, 2021, 3 pages.

(Continued)

*Primary Examiner* — Ronald Hinson
(74) *Attorney, Agent, or Firm* — Keating & Bennett, LLP

(57) ABSTRACT

A multilayer board includes a first insulator layer including a first coil pattern thereon, a second insulator layer including a second coil pattern thereon, a third insulator layer including a third coil pattern thereon, a first terminal on the first insulator layer and connected to one end of the first coil pattern, a first floating pattern on the first insulator layer and not connected to the first coil pattern, and a second terminal on the third insulator layer and connected to one end of the third coil pattern. The first, second, and third insulator layers are sequentially laminated. The first, second, and third coil patterns are respectively electrically connected in sequence. The first floating pattern overlaps the second coil pattern when viewed from a laminating direction.

21 Claims, 19 Drawing Sheets

(51) Int. Cl.
  *H01F 27/29* (2006.01)
  *H05K 1/02* (2006.01)
  *H05K 1/16* (2006.01)
  *H05K 3/46* (2006.01)

(52) U.S. Cl.
  CPC ........... *H05K 1/165* (2013.01); *H05K 3/4632* (2013.01); *H01F 2027/2809* (2013.01)

(58) Field of Classification Search
  USPC ........................................................ 336/200
  See application file for complete search history.

(56) References Cited

U.S. PATENT DOCUMENTS

| | | | | |
|---|---|---|---|---|
| 2011/0024510 A1* | 2/2011 | Kato | ................ | G06K 19/07784 |
| | | | | 235/492 |
| 2011/0050381 A1* | 3/2011 | Olson | ................ | H01F 17/0006 |
| | | | | 336/200 |
| 2011/0241816 A1* | 10/2011 | Park | ........................ | H01F 41/34 |
| | | | | 336/200 |
| 2014/0266547 A1* | 9/2014 | Watanabe | ............. | H01F 41/042 |
| | | | | 336/200 |
| 2014/0375351 A1 | 12/2014 | Fukami | | |
| 2016/0336106 A1* | 11/2016 | Chung | .................... | H01F 17/04 |
| 2017/0011838 A1 | 1/2017 | Asada | | |
| 2017/0271073 A1* | 9/2017 | Zeng | ...................... | H01F 27/346 |
| 2017/0365389 A1* | 12/2017 | Yosui | .................. | H01F 17/0013 |
| 2018/0374623 A1 | 12/2018 | Ito et al. | | |
| 2023/0245813 A1* | 8/2023 | Okumura | ............ | H01F 27/2804 |
| | | | | 336/200 |

FOREIGN PATENT DOCUMENTS

| | | | |
|---|---|---|---|
| JP | 6414649 | B2 | 10/2018 |
| JP | 2020088318 | A | 6/2020 |
| WO | 2015152333 | A1 | 10/2015 |

OTHER PUBLICATIONS

International Written Opinion in PCT/JP2021/002270, mailed Mar. 9, 2021, 4 pages.

* cited by examiner

MULTILAYER BOARD, ELECTRONIC DEVICE, AND MULTILAYER BOARD INSPECTION METHOD

CROSS REFERENCE TO RELATED APPLICATIONS

This application claims the benefit of priority to Japanese Patent Application No. 2020-009818 filed on Jan. 24, 2020 and is a Continuation Application of PCT Application No. PCT/JP2021/002270 filed on Jan. 22, 2021. The entire contents of each application are hereby incorporated herein by reference.

BACKGROUND OF THE INVENTION

1. Field of the Invention

The present invention relates to a multilayer board, an electronic device including the multilayer board, and a multilayer board inspection method.

2. Description of the Related Art

Conventionally, there is a multilayer board including a plurality of layers having a conductor pattern formed thereon. In the multilayer board, a short-circuit failure may occur at the time of manufacture. For example, Japanese Patent No. 6414649 describes a method of detecting a short-circuit failure occurring in the multilayer board.

When a product failure, such as a short-circuit failure is detected, it is required to inspect the layers one by one to detect on which layer of the multilayer board a failure has occurred, and the number of man-hours for measurement increases in accordance with the total number of coil patterns.

SUMMARY OF THE INVENTION

Preferred embodiments of the present invention provide multilayer boards, electronic devices, and multilayer board inspection methods in each of which when a product failure occurs, the number of man-hours for measurement to detect a failed component is able to be reduced.

A multilayer board according to a preferred embodiment of the present invention includes a first insulator layer including a first coil pattern thereon, a second insulator layer including a second coil pattern thereon, a third insulator layer including a third coil pattern thereon, a first terminal on the first insulator layer and connected to one end of the first coil pattern, a first floating pattern on the first insulator layer and not connected to the first coil pattern, and a second terminal electrically connected to one end of the third coil pattern, wherein the first insulator layer, the second insulator layer, and the third insulator layer are sequentially laminated, the first coil pattern, the second coil pattern, and the third coil pattern are respectively electrically connected in sequence, and the first floating pattern overlaps the second coil pattern when viewed from a laminating direction.

An electronic device according to a preferred embodiment of the present invention includes a multilayer board according to a preferred embodiment of the present invention, wherein the first floating pattern is not connected to a power supply of the electronic device.

A method of inspecting a multilayer board including a first insulator layer including a first coil pattern thereon, a second insulator layer including a second coil pattern thereon, a third insulator layer including a third coil pattern thereon, a first terminal on the first insulator layer and connected to one end of the first coil pattern, a first floating pattern on the first insulator layer and not connected to the first coil pattern, and a second terminal on the third insulator layer and connected to one end of the third coil pattern, the first insulator layer, the second insulator layer, and the third insulator layer being sequentially laminated, the first coil pattern, the second coil pattern, and the third coil pattern being respectively electrically connected in sequence, and the first floating pattern overlapping the second coil pattern when viewed from a laminating direction, the method including measuring electrical characteristics between the first floating pattern and the first terminal.

A method of inspecting a multilayer board including a first insulator layer including a first coil pattern thereon, a second insulator layer including a second coil pattern thereon, a third insulator layer including a third coil pattern thereon, a fourth insulator layer including a fourth coil pattern thereon, a first terminal on the first insulator layer and connected to one end of the first coil pattern, a first floating pattern on the first insulator layer and not connected to the first coil pattern, a second terminal on the fourth insulator layer and connected to one end of the fourth coil pattern, and a second floating pattern on the fourth insulator layer and not connected to the fourth coil pattern, the first insulator layer, the second insulator layer, the third insulator layer, and the fourth insulator layer being sequentially laminated, the first coil pattern, the second coil pattern, the third coil pattern, and the fourth coil pattern being respectively electrically connected in sequence, the second coil pattern overlapping the first floating pattern when viewed from a laminating direction, and the third coil pattern overlapping the second floating pattern when viewed from the laminating direction, the method including inspecting electrical characteristics between the first floating pattern and the second terminal.

According to preferred embodiments of the present invention, multilayer boards are each able to be provided in which when a product failure occurs, the number of man-hours for measurement to detect a failed component is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
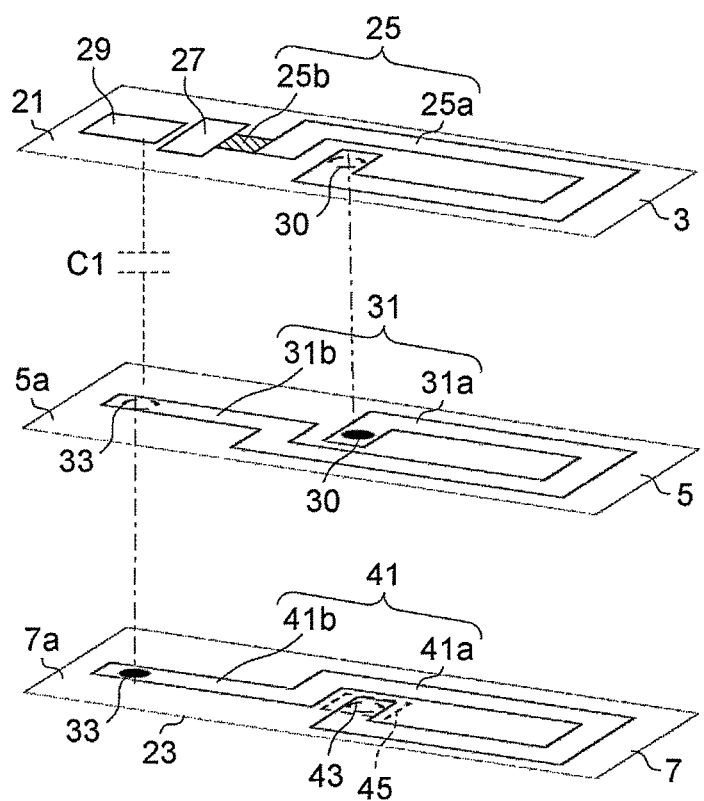
FIG. 1A is an exploded perspective view showing a multilayer board according to Preferred Embodiment 1 of the present invention.

A multilayer board according to a preferred embodiment of the present invention includes a first insulator layer including a first coil pattern thereon, a second insulator layer including a second coil pattern thereon, a third insulator layer including a third coil pattern thereon, a first terminal on the first insulator layer and connected to one end of the first coil pattern, a first floating pattern on the first insulator layer and not connected to the first coil pattern, and a second terminal electrically connected to one end of the third coil pattern. The first insulator layer, the second insulator layer, and the third insulator layer are sequentially laminated. The first coil pattern, the second coil pattern, and the third coil pattern are respectively electrically connected in sequence. The first floating pattern overlaps the second coil pattern when viewed from a laminating direction.

According to the above-described preferred embodiment, a multilayer board can be provided in which when a product failure occurs, the number of man-hours for measurement to detect a failed component can be reduced.

The second coil pattern may include a coil portion having a loop shape and an extending portion extending outward from the coil portion of the second coil pattern, and the first floating pattern may overlap the extending portion of the second coil pattern when viewed from the laminating direction. In the specification, the "extending portion extending outward" means that the extending portion extends outward from the winding center with respect to the winding direction of the coil, and also includes a case in which the extending portion extends outward because, even if it extends along the winding direction of the coil portion, the pattern width of the extending portion is larger than the pattern width of the coil portion.

The second coil pattern may include a coil portion having a loop shape and an extending portion extending outward from the coil portion of the second coil pattern, an end portion of the extending portion of the first coil pattern may be connected to the first terminal, and the first floating pattern may overlap the coil portion of the second coil pattern when viewed from the laminating direction. With this arrangement, the first floating pattern can be provided at a position spaced away from the first coil pattern, and it is thus possible to reduce or prevent the first floating pattern from erroneously being connected to the first coil pattern even with a pattern deviation.

The first floating pattern may be provided along a shape of the first coil pattern. With this, an occurrence of a pattern deviation can be reduced or prevented at the time of multilayer board formation.

The first floating pattern may be provided along the coil portion of the first coil pattern.

The first floating pattern is provided on a terminal formation layer including the first terminal provided thereon.

The second terminal may be provided on the third insulator layer.

The first coil pattern may include a coil portion having a loop shape and an extending portion extending outward from the coil portion of the first coil pattern. An end portion of the extending portion of the first coil pattern may be connected to the first terminal. The first floating pattern may be opposed to an extending direction of the extending portion of the first coil pattern.

The first floating pattern may be disposed near the first terminal.

An area of the first floating pattern may be larger than an area of the extending portion of the second coil pattern.

An area of the extending portion of the second coil pattern may be larger than an area of the first floating pattern.

The extending portion of the second coil pattern may be connected to an interlayer connection conductor to connect to the third coil pattern.

A fourth insulator layer may be provided, the fourth insulator layer being laminated with respect to the third insulator layer oppositely to the second insulator layer and including a conductor pattern thereon. The second terminal may be provided on the fourth insulator layer and connected via the conductor pattern to the third coil pattern.

A second floating pattern may be provided, the second floating pattern being provided on the fourth insulator layer and not connected to the conductor pattern. The second floating pattern may overlap the third coil pattern when viewed from the laminating direction.

The third coil pattern may include a coil portion having a loop shape and an extending portion extending outward from the coil portion of the third coil pattern. The second floating pattern may overlap the extending portion of the third coil pattern when viewed from the laminating direction.

The conductor pattern may include a coil portion having in a loop shape and an extending portion extending outward from the coil portion of the conductor pattern. An end portion of the extending portion of the conductor pattern may be connected to the second terminal. The second floating pattern may extend in an extending direction of the extending portion of the conductor pattern.

The second floating pattern may be disposed near the second terminal.

An area of the extending portion of the third coil pattern may be larger than an area of the second floating pattern.

An area of the second floating pattern may be larger than an area of the extending portion of the third coil pattern.

The extending portion of the third coil pattern may be connected to an interlayer connection conductor to connect to the second coil pattern.

A fifth insulator layer and a sixth insulator layer may be provided between the third insulator layer and the fourth insulator layer, the fifth insulator layer including a conductor pattern thereon, the sixth insulator layer including a sixth coil pattern formed thereon. The fifth insulator layer and the sixth insulator layer may be sequentially laminated from the third insulator layer side. The third coil pattern, the conductor pattern of the fifth insulator layer, the sixth coil pattern, and the conductor pattern of the fourth insulator layer may be connected.

In an electronic device which includes the multilayer board, the first floating pattern is not connected to a power supply of the electronic device.

In a method of inspecting a multilayer board according to a preferred embodiment of the present invention, the multilayer board includes a first insulator layer including a first coil pattern thereon, a second insulator layer including a second coil pattern thereon, a third insulator layer including a third coil pattern thereon, a first terminal on the first insulator layer and connected to one end of the first coil pattern, a first floating pattern on the first insulator layer and not connected to the first coil pattern, and a second terminal on the third insulator layer and connected to one end of the third coil pattern. The first insulator layer, the second insulator layer, and the third insulator layer are sequentially laminated. The first coil pattern, the second coil pattern, and the third coil pattern are respectively electrically connected in sequence. The first floating pattern overlaps the second coil pattern when viewed from a laminating direction. The method includes measuring electrical characteristics between the first floating pattern and the first terminal.

Electrical characteristics may be measured between the first floating pattern and the second terminal.

In a method of inspecting a multilayer board according to a preferred embodiment of the present invention, the multilayer board includes a first insulator layer including a first coil pattern thereon, a second insulator layer including a second coil pattern thereon, a third insulator layer including a third coil pattern thereon, a fourth insulator layer including a fourth coil pattern thereon, a first terminal on the first insulator layer and connected to one end of the first coil pattern, a first floating pattern on the first insulator layer and not connected to the first coil pattern, a second terminal on the fourth insulator layer and connected to one end of the fourth coil pattern, and a second floating pattern on the fourth insulator layer and not connected to the fourth coil pattern. The first insulator layer, the second insulator layer, the third insulator layer, and the fourth insulator layer are sequentially laminated. The first coil pattern, the second coil pattern, the third coil pattern, and the fourth coil pattern are respectively electrically connected in sequence. The second coil pattern overlaps the first floating pattern when viewed from a laminating direction. The third coil pattern overlaps the second floating pattern when viewed from the laminating direction. The method includes inspecting electrical characteristics between the first floating pattern and the second terminal.

Electrical characteristics are measured between the second floating pattern and the first terminal.

A multilayer board according to a preferred embodiment of the present invention is described below with reference to the drawings. Members having a same or substantially a same function and structure are provided with the same reference characters in the drawings and their description may be omitted in the specification. Also, in the drawings, for ease of understanding, each component is predominantly depicted in a schematic manner.

The preferred embodiments of the present invention described below are each one specific example of the present invention and the present invention is not restricted by this structure. Also, numerical values, shapes, structures, steps, the sequence of the steps, and so forth specifically described in the preferred embodiments below are merely examples and do not restrict the present invention. Of the components in the preferred embodiments below, components not described in independent claims indicating the highest concepts are described as arbitrary or optional components. Also, in all of the preferred embodiments, the same is true for the structure in each modification, and the structures described in the respective modifications may be combined.

Preferred Embodiment 1

Figure 1B:
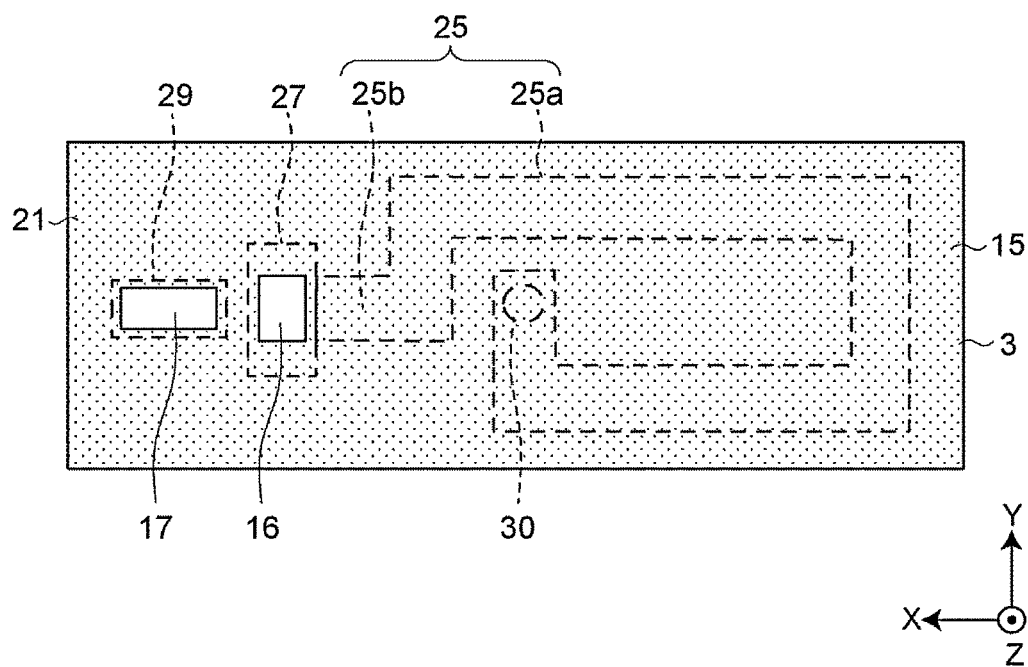
FIG. 1B is a plan view of a first principal surface of the multilayer board of Preferred Embodiment 1 of the present invention.

A multilayer board according to Preferred Embodiment 1 of the present invention is described below. FIG. 1A is an exploded perspective view showing the multilayer board of Preferred Embodiment 1. FIG. 1B is a plan view of a first principal surface of the multilayer board of Preferred Embodiment 1. In the drawings, an X-Y-Z coordinate system is to facilitate understanding of the present invention and is not to restrict the present invention. The X-axis direction indicates a longitudinal direction of a multilayer board 1, the Y-axis direction indicates a width direction of the multilayer board 1, and the Z-axis direction indicates a laminating direction of the multilayer board 1. The X, Y, and Z directions are orthogonal or substantially orthogonal to one another.

Multilayer Board

The multilayer board 1 includes a first insulator layer 3, a second insulator layer 5, and a third insulator layer 7. Each is made of thermoplastic resin such as, for example, a liquid-crystal polymer or thermoplastic polyimide. The multilayer board 1 is formed by collectively forming the first insulator layer 3, the second insulator layer 5, and the third insulator layer 7 by heating in the laminating direction. The first insulator layer 3, the second insulator layer 5, and the third insulator layer 7 each have, for example, a rectangular or substantially rectangular shape, and each have the same or substantially the same size.

The multilayer board 1 includes a first principal surface 21 and a second principal surface 23 opposed to each other in the laminating direction (Z direction) of the first insulator layer 3 to the third insulator layer 7. On a front side of the first insulator layer 3 defining the first principal surface 21 of the multilayer board 1, a first coil pattern 25, which is a conductor pattern, is provided. The first coil pattern 25 includes a first coil portion 25a having a loop shape and a first extending portion 25b extending from one end of the first coil portion 25a outward in the longitudinal direction (X direction) of the first insulator layer 3.

Also, on the front side of the first insulator layer 3, a first terminal 27 is provided to which one end of the first coil pattern 25, that is, an end portion of the first extending portion 25b, is connected. The first terminal 27 is an input/output terminal of the multilayer board 1. The pattern width of the first terminal 27 is larger than the pattern width of the first coil portion 25a and the first extending portion 25b. The first terminal 27 having a width larger than that of the first coil pattern 25 is a region of an implemented portion overlapping a conductive binder such as, for example, solder or is a portion exposed from a resist opening. With this, connection with the first terminal 27 can be easily made.

Also, on the front side of the first insulator layer 3, a first floating pattern 29 not connected to the first coil pattern 25 is provided. The first floating pattern 29 is provided on a terminal formation layer (first insulator layer 3) including the first terminal 27 provided thereon. The first floating pattern 29 is disposed near the first terminal 27, and extends in a direction in which the first extending portion 25b extends. The first floating pattern 29 may be formed by, for example, forming the same pattern contiguous to the first coil pattern 25 and the first terminal 27, then forming a slit between the first terminal 27 and the first floating pattern 29, and isolating both from each other. The first floating pattern 29 is a pattern for inspection. While the insulator layers, the coil patterns, and the floating patterns each have a thickness in the specification, the thickness is shown in a simplified manner in each drawing.

As shown in FIG. 1B, a protective film 15 is laminated on the front surface of a first principal surface 21 side of the first insulator layer 3. Therefore, the first coil pattern 25 is covered with the protective film 15. Cavities 16 and 17 are respectively provided on the first terminal 27 and the first floating pattern 29, and a partial region of each of the first terminal 27 and the first floating pattern 29 is externally exposed. The other region of each of the first terminal 27 and the first floating pattern 29 is covered with the protective film 15. The protective film 15 is, for example, a resist or coverlay. Through the cavities 16 and 17, a measurement probe can make contact with the first terminal 27 and the first floating pattern 29. Referring to FIG. 1A, the other end of the first coil pattern 25, that is, the other end of the first coil portion 25a, is connected to a first interlayer connection conductor 30 connected to a second coil pattern 31 provided on the second insulator layer 5.

On a front surface 5a defining a first principal surface 21 side of the second insulator layer 5, a second coil pattern 31, which is a conductor pattern, is provided. The second coil pattern 31 includes a second coil portion 31a having a loop shape and a second extending portion 31b extending from one end of the second coil portion 31a outward in the longitudinal direction (X direction) of the second insulator layer 5. The other end of the second coil portion 31a is connected to the first interlayer connection conductor 30.

The first floating pattern 29 overlaps the second extending portion 31b of the second coil pattern 31 when viewed from the laminating direction. Therefore, two conductors, that is, the first floating pattern 29 and the second coil pattern 31, and the first insulator layer 3 interposed therebetween cause a capacitive component C1. For example, the width of the first floating pattern 29 is larger than the width of the second extending portion 31b of the second coil pattern 31, or the width of the second extending portion 31b of the second coil pattern 31 is larger than the width of the first floating pattern 29. The area of the first floating pattern 29 may be larger than the area of the second extending portion 31b of the second coil pattern 31, or the area of the second extending portion 31b of the second coil pattern 31 may be larger than the area of the first floating pattern 29. With this, when viewed from the laminating direction, either one of the first floating pattern 29 and the second extending portion 31b can completely overlap the other, and thus the value of the capacitive component C1 can be stabilized. Because the second extending portion 31b is associated with coil characteristics, the coil characteristics value is stabilized when the width of the first floating pattern 29 is larger than the width of the second extending portion 31b of the second coil pattern 31. The shape of each of the first floating pattern 29 and a tip portion of the second extending portion 31b opposed to the first floating pattern 29 is not limited to a rectangular or substantially rectangular shape but may be a circular or substantially circular shape or a triangular or substantially triangular shape.

One end of the second coil pattern 31, that is, an end portion of the second extending portion 31b, is connected to a second interlayer connection conductor 33 connected to a third coil pattern 41 formed on the third insulator layer 7.

On a front surface 7a defining a first principal surface 21 side of the third insulator layer 7, the third coil pattern 41, which is a conductor pattern, is provided. The third coil pattern 41 includes a third coil portion 41a having a loop shape and a third extending portion 41b extending from one end of the third coil portion 41a outward in the longitudinal direction (X direction) of the third insulator layer 7.

An end portion of the third extending portion 41b is connected to the second interlayer connection conductor 33. Therefore, the first coil pattern 25, the second coil pattern 31, and the third coil pattern 41 are respectively electrically connected in sequence. The other end of the third coil portion 41a is connected to a third interlayer connection conductor 43. The third interlayer connection conductor 43 is connected to a second terminal 45 provided on the back side of the third insulator layer 7 defining the second principal surface 23 of the multilayer board 1. The second terminal 45 is an input/output terminal. The pattern width of the second terminal 45 is larger than the pattern width of the third coil portion 41a and the third extending portion 41b. The second terminal 45 having a width larger than that of the third coil pattern 41 is a region of an implemented portion overlapping a conductive binder such as, for example, solder or is a portion exposed from a resist opening. With this, connection with the second terminal 45 can be easily made.

Each of the first coil pattern 25, the second coil pattern 31, the third coil pattern 41, the first terminal 27, the second terminal 45, and the first floating pattern 29 described above is a conductor made of a metal foil such as, for example, a copper foil. Also, the first interlayer connection conductor 30, the second interlayer connection conductor 33, and the third interlayer connection conductor 43 are conductors made of a solidified (metalized) conductive paste filling through holes provided in the first insulator layer 3, the second insulator layer 5, and the third insulator layer 7, respectively.

The first coil portion 25a, the second coil portion 31a, and the third coil portion 41a at least partially overlap one another when viewed from the laminating direction. When a voltage is applied between the first terminal 27 and the second terminal 45, a current flows in the same direction. With this, the orientations of magnetic fluxes passing through the inside of the first coil portion 25a, the second coil portion 31a, and the third coil portion 41a are aligned and, also the Q value is improved.

Figure 2:
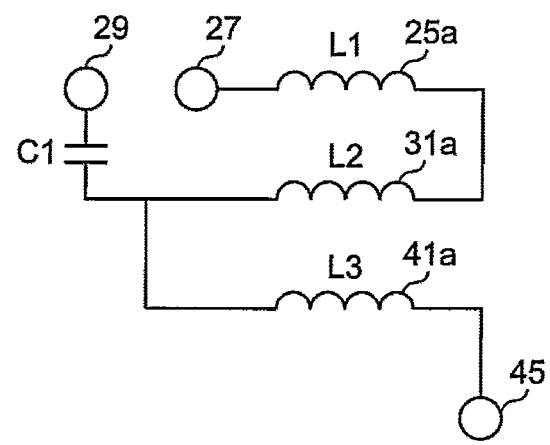
FIG. 2 is a circuit diagram of the multilayer board of Preferred Embodiment 1 of the present invention.

Next, with reference to FIG. 2, the circuit of the multilayer board 1 is described. FIG. 2 is a circuit diagram of the multilayer board 1 of Preferred Embodiment 1. An inductance L of the multilayer board 1, that is, the inductance L occurring between the first terminal 27 and the second terminal 45, has a predetermined value L0, which is a value of inductance when no circuit failure is present. With the use of an inductance L1 of the first coil pattern 25, an inductance L2 of the second coil pattern 31, and an inductance L3 of the third coil pattern 41, the predetermined value can be represented as L0=L1+L2+L3. Also, the capacitive component C1 between the first floating pattern 29 and the second extending portion 31b of the second coil pattern 31 is connected as branched between the inductances L2 and L3.

Inspection Method

Figure 3:
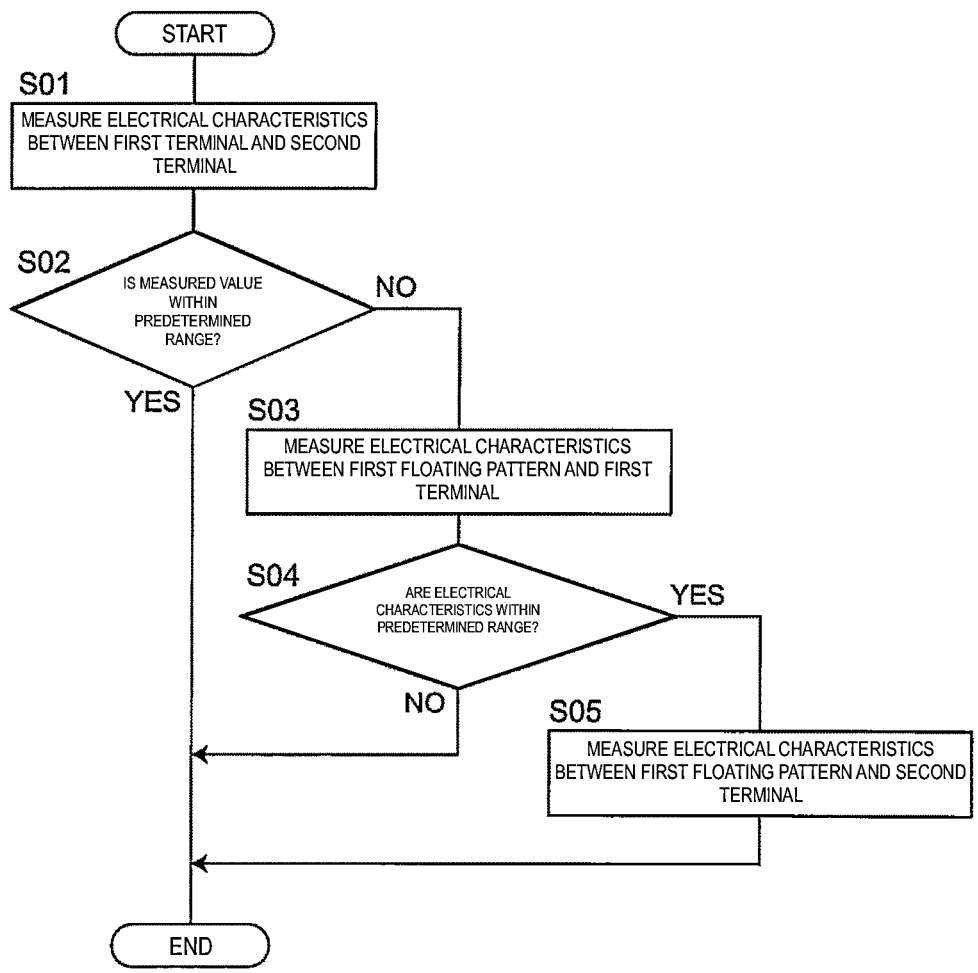
FIG. 3 is a flowchart showing a flow of a method of inspecting the multilayer board of Preferred Embodiment 1 of the present invention.

Next, a non-limiting example of a method of inspecting the multilayer board 1 is described with reference to FIG. 2 and FIG. 3. FIG. 3 is a flowchart showing a flow of the method of inspecting the multilayer board 1.

At step S01, the probe is touched on each of the first terminal 27 and the second terminal 45 to measure electrical characteristics between the first terminal 27 and the second terminal 45. At step S02, it is determined whether the measured value is within a predetermined range. When the measured value is within the predetermined range (Yes at step S02), the measured multilayer board 1 is determined as a conforming article, and the inspection ends. When the measured value is not within the predetermined range (No at step S02), it can be determined that a failure (for example, any of a short-circuit failure, a breaking failure, and a fluctuation of the L value) has occurred in any of the first coil pattern 25 to the third coil pattern 41.

In this case, at step S03, electrical characteristics between the first floating pattern 29 and the first terminal 27 are measured. Between the first floating pattern 29 and the first terminal 27, the capacitive component C1 and the inductances L2 and L1 are present. As electrical characteristics, for example, LC resonant frequencies of these are measured. At step S04, it is determined whether the measured value is within a predetermined range.

Figure 4:
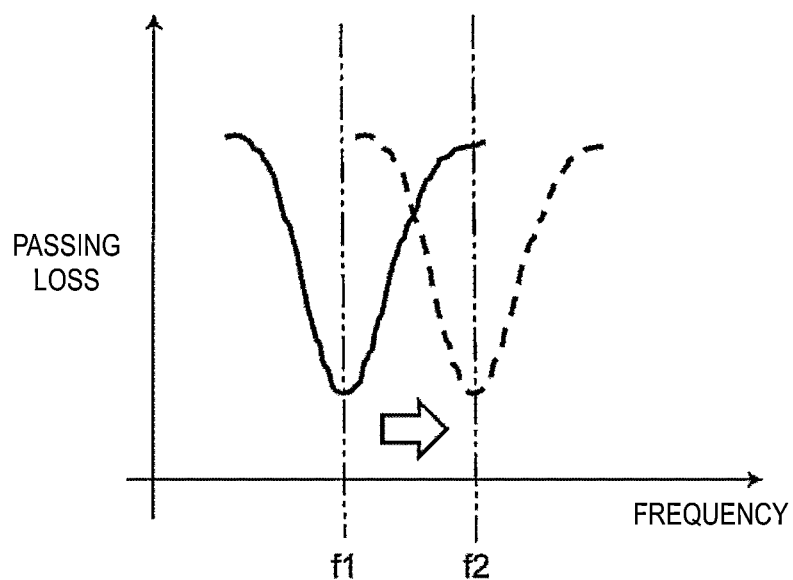
FIG. 4 is a descriptive diagram showing one example of electrical characteristics during inspection.

As shown in FIG. 4, when the measured value as a passing loss is within an allowable range from f1 as a theoretical value, that is, when the electrical characteristics are within the predetermined range (Yes at step S04), it can be determined that no failure has occurred in the first coil pattern 25 of the first insulator layer 3 and the second coil pattern 31 of the second insulator layer 5. Therefore, in this case, it can be determined that a failure has occurred in the third coil pattern 41 of the third insulator layer 7. At step S05, by measuring electrical characteristics between the first floating pattern 29 and the second terminal 45, it can be confirmed that a failure has occurred in the third coil pattern 41 of the third insulator layer 7. Between the first floating pattern 29 and the second terminal 45, the capacitive component C1 and the inductance L3 are present. As electrical characteristics, for example, by measuring LC resonant frequencies of these, it can be confirmed that a failure has occurred in the third coil pattern 41.

Also at step S04, when the measured value is, for example, f2, which is outside of the allowable range from f1 as the theoretical value, that is, when the electrical characteristics are not within the predetermined range (No at step S04), it can be determined that a failure has occurred in either of the first coil pattern 25 of the first insulator layer 3 and the second coil pattern 31 of the second insulator layer 5.

In this manner, if the multilayer board 1 with a product failure has occurred in the inspection regarding the electrical characteristics of the multilayer board 1, it can be detected on which coil pattern provided on the first insulator layer 3 and the second insulator layer 5 or provided on the third insulator layer 7 the failure has occurred among the three insulator layers.

Electronic Device

Figure 5A:
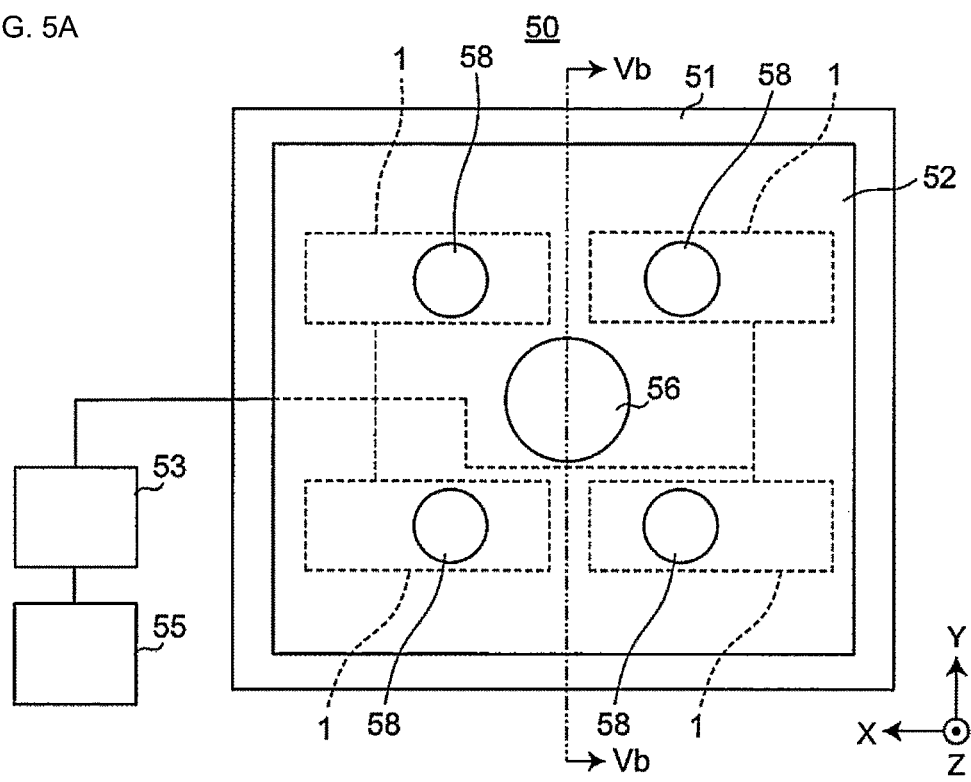
FIG. 5A is a plan view showing one example of an electronic device including the multilayer boards.
Figure 5B:
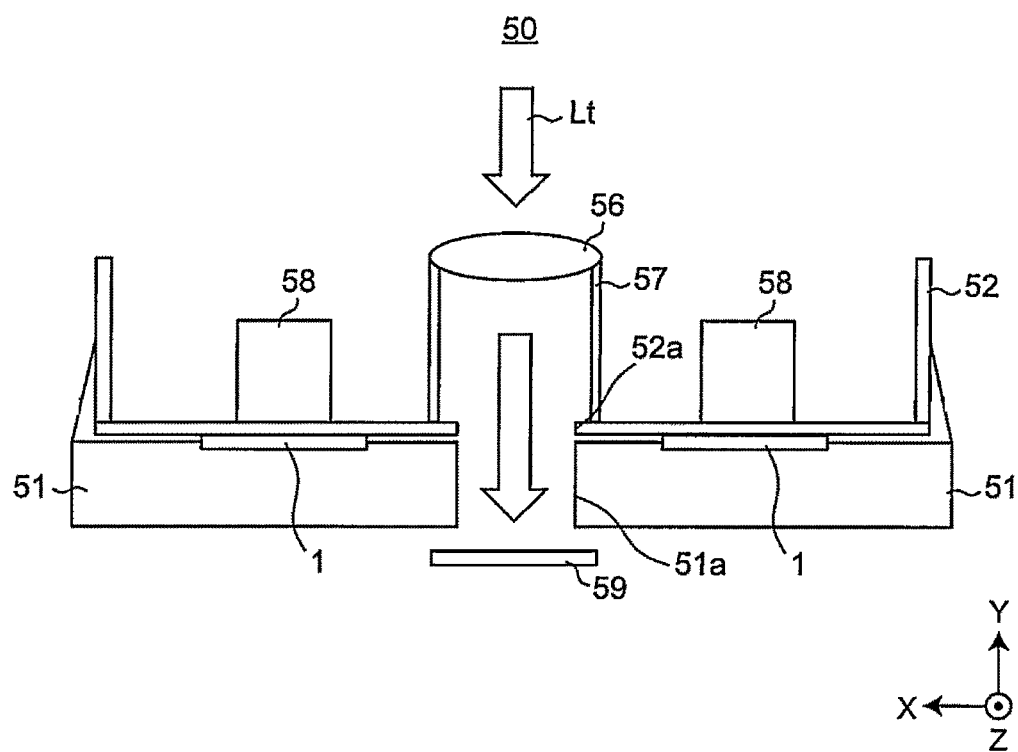
FIG. 5B is a sectional view showing one example of an electronic device including the multilayer boards.

FIG. 5A is a plan view showing one example of an electronic device 50 including the multilayer boards 1. FIG. 5B is a sectional view showing one example of the electronic device 50 including the multilayer boards 1, and is a sectional view in a Vb arrow view of FIG. 5A. The electronic device 50 is, for example, a camera module. The electronic device 50 includes four multilayer boards 1, a board 51 with each multilayer board 1 provided thereon, a frame 52 opposing the board 51 so as to cover each multilayer board 1, a power supply portion 53 which supplies power to the multilayer boards 1, and a control portion 55 which controls power to be supplied from the power supply portion 53 to the multilayer boards 1.

In the frame 52, a permanent magnet 58 is opposed to each multilayer board 1. Also, a hollow cylindrical lens holder 57 is provided at a central portion of the frame 52, and a lens 56 is provided on the lens holder 57. A through hole 52a is provided at the central portion of the frame 52, and a through hole 51a is also provided at a central portion of the board 51. An image pickup element 59 is provided below the through hole 51a. The lens 56, the through hole 52a, the through hole 51a, and the image pickup element 59 are each arranged on a straight line, and light Lt incident to the lens 56 passes through the inside of the lens holder 57, the through hole 52a, and the through hole 51a to enter the image pickup element 59.

The first terminal 27 and the second terminal 45 of each multilayer board 1 are each connected to the power supply portion 53. With an instruction from the control portion 55, power is supplied from the power supply portion 53 via the first terminal 27 and the second terminal 45 to cause a magnetic field. With the caused magnetic field, the lens holder 57 moves to a horizontal direction or a vertical direction. This moves the lens 56 to the horizontal direction or the vertical direction. With the lens 56 moving to the vertical direction, focus adjustment can be performed.

The first floating pattern 29 of the multilayer board 1 is not connected to the power supply portion 53, and is not supplied with power from the power supply portion 53.

As described above, the multilayer board 1 includes the first insulator layer 3 including the first coil pattern 25 provided thereon, the second insulator layer 5 including the second coil pattern 31 provided thereon, the third insulator layer 7 including the third coil pattern 41 provided thereon, the first terminal 27 provided on the first insulator layer 3 and connected to one end of the first coil pattern 25, the first floating pattern 29 provided on the first insulator layer 3 and not connected to the first coil pattern 25, and the second terminal 45 connected to one end of the third coil pattern 41. The first insulator layer 3, the second insulator layer 5, and the third insulator layer 7 are sequentially laminated, the first coil pattern 25, the second coil pattern 31, and the third coil pattern 41 are respectively electrically connected in sequence, and the first floating pattern overlaps the second coil pattern 31 when viewed from the laminating direction. With the structure of these, since the first floating pattern 29 and the second coil pattern 31 overlap each other when viewed from the laminating direction, a capacitive component occurs between the first floating pattern 29 and the second coil pattern 31. By using this capacitive component, electrical characteristics between the first terminal 27 and the first floating pattern 29 and between the first floating pattern 29 and the second terminal 45 can be measured. With this, it can be detected on which of the first coil pattern 25 and the second coil pattern 31 or the third coil pattern 41 the failure has occurred, and the multilayer board 1 with reduced efforts to detect the locations of breaking and short-circuit failures can be provided.

Also, the second coil pattern 31 includes the second coil portion 31a having a loop shape and the second extending portion 31b extending outward from the second coil portion 31a of the second coil pattern 31. The first floating pattern 29 overlaps the second extending portion 31b of the second coil pattern 31 when viewed from the laminating direction.

Also, the first coil pattern 25 includes the first coil portion 25a having a loop shape and the first extending portion 25b extending outward from the first coil portion 25a of the first coil pattern 25. The end portion of the first extending portion 25b of the first coil pattern 25 is connected to the first terminal 27, and the first floating pattern 29 extends in the extending direction of the first extending portion 25b of the first coil pattern 25. With this, since the first floating pattern 29 is aligned along the first extending portion 25b, it is possible to reduce or prevent the first floating pattern 29 from erroneously being connected to the first coil pattern 25 due to a deviation of the first floating pattern 29 at the time of collectively forming the multilayer board 1 by heating.

The first floating pattern 29 is disposed near the first terminal 27. For example, a distance between the first floating pattern 29 and the first terminal 27 is smaller than the width of the first coil portion 25a.

The width of the first floating pattern 29 is larger than the width of the second extending portion 31b of the second coil pattern 31 or the width of the second extending portion 31b of the second coil pattern 31 is larger than the width of the first floating pattern 29. With this, one of the first floating pattern 29 and the second extending portion 31b of the second coil pattern 31 can completely overlap the other, and thus the value of the capacitive component C1 occurring between the first floating pattern 29 and the second extending portion 31b is stabilized. This can improve measurement accuracy.

The second extending portion 31b of the second coil pattern 31 is connected to the second interlayer connection conductor 33 to connect to the third coil pattern 41.

Also, in the electronic device 50 which includes the multilayer board 1, the first floating pattern 29 is not connected to the power supply part 53 of the electronic device 50.

Also, in the method of inspecting the multilayer board 1, electrical characteristics between the first floating pattern 29 and the first terminal 27 are measured. With this, it can be detected on which of the first coil pattern 25 and the second coil pattern 31 or the third coil pattern 41 the failure has occurred, and efforts to detect the locations of breaking and short-circuit failures can be reduced.

Preferred Embodiment 2

Figure 6:
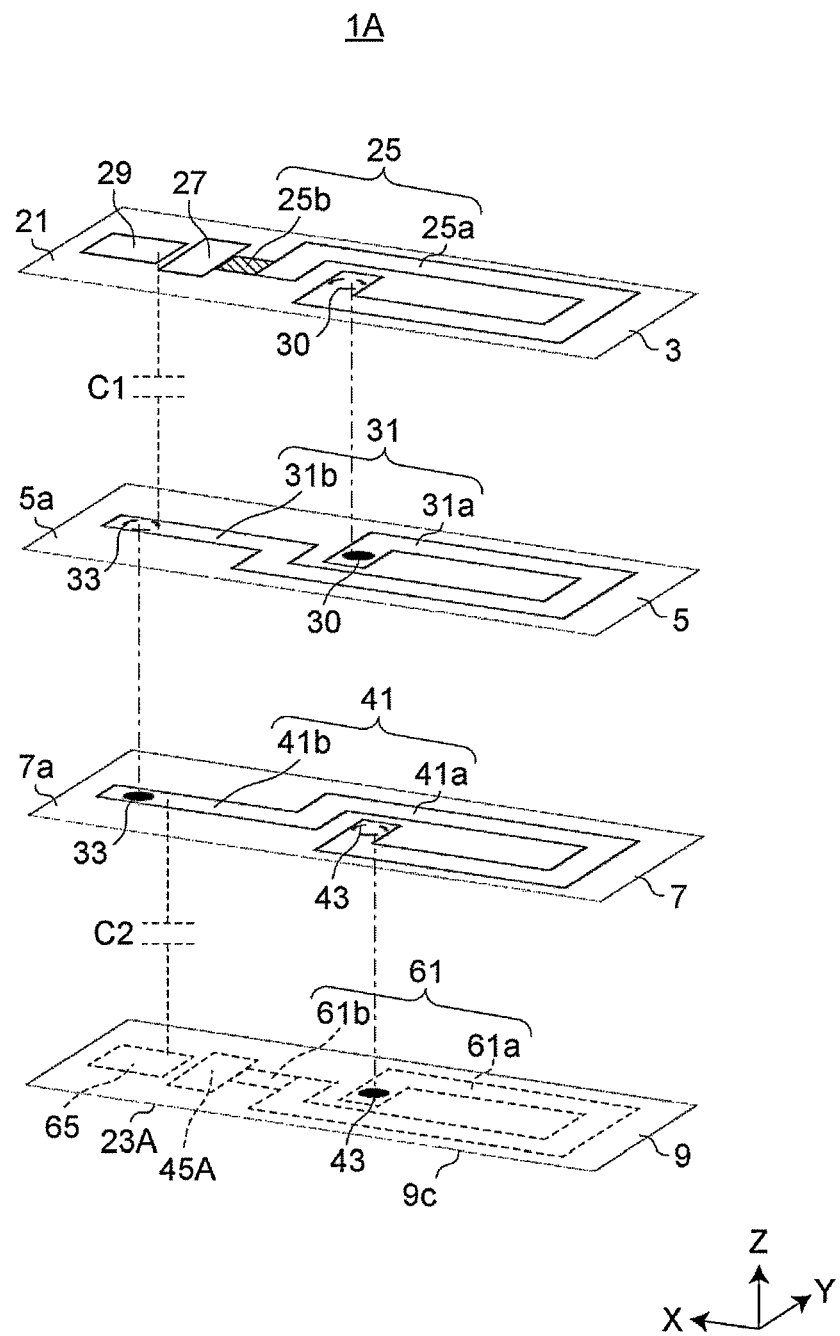
FIG. 6 is an exploded perspective view showing a multilayer board according to Preferred Embodiment 2 of the present invention.

Next, a multilayer board 1A according to Preferred Embodiment 2 of the present invention is described with reference to FIG. 6. FIG. 6 is a diagram showing the structure of the multilayer board 1A of Preferred Embodiment 2.

The multilayer board 1A of Preferred Embodiment 2 includes, as a fourth layer, a fourth insulator layer 9 including a fourth coil pattern 61 provided thereon being added to the multilayer board 1 of Preferred Embodiment 1. The structure of the multilayer board 1A in Preferred Embodiment 2 other than matters described below is common to that of the multilayer board 1 of Preferred Embodiment 1.

On a back surface 9c defining a second principal surface 23A side of the fourth insulator layer 9, the fourth coil pattern 61, which is a conductor pattern, is provided. The fourth coil pattern 61 includes a fourth coil portion 61a having a loop shape and a fourth extending portion 61b extending from one end of the fourth coil portion 61a outward in the longitudinal direction (X direction) of the fourth insulator layer 9.

On the back surface 9c of the fourth insulator layer 9, a second terminal 45A connected to one end of the fourth coil pattern 61, that is, an end portion of the fourth extending portion 61b, is provided. The second terminal 45A is an input/output terminal of the multilayer board 1.

Also, on the back surface of the fourth insulator layer 9, a second floating pattern 65 not connected to the fourth coil pattern 61 is provided. The second floating pattern 65 is near the second terminal 45A. For example, the distance between the second floating pattern 65 and the second terminal 45A is shorter than the pattern width of the fourth coil portion 61a. The second floating pattern 65 extends in the extending direction of the fourth extending portion 61b. The second floating pattern 65 may be formed by, for example, forming the same pattern contiguous to the fourth coil pattern 61 and the second terminal 45A, then forming a slit between the second terminal 45A and the second floating pattern 65, and isolating both from each other. The second floating pattern 65 is a pattern for inspection.

The other end of the fourth coil pattern 61, that is, the other end of the fourth coil portion 61a, is connected to the third interlayer connection conductor 43 connected to the third coil pattern 41 formed on the third insulator layer 7.

The second floating pattern 65 overlaps the third extending portion 41b of the third coil pattern 41 when viewed from the laminating direction. Therefore, two conductors, that is, the second floating pattern 65 and the third coil pattern 41, and the third insulator layer 7 and the fourth insulator layer 9 interposed therebetween cause a capacitive component C2. For example, the width of the second floating pattern 65 is larger than the width of the third extending portion 41b of the third coil pattern 41, or the width of the third extending portion 41b of the third coil pattern 41 is larger than the width of the second floating pattern 65. With this, when viewed from the laminating direction, either one of the second floating pattern 65 and the third extending portion 41b can completely overlap the other, and thus the value of the capacitive component C2 can be stabilized. Note that the third extending portion 41b is associated with coil characteristics, the coil characteristics value is stabilized when the width of the second floating pattern 65 is larger than the width of the third extending portion 41b of the third coil pattern 41. The shape of each of the second floating pattern 65 and a tip portion of the third extending portion 41b opposed to the second floating pattern 65 is not limited to a rectangular or substantially rectangular shape but may be a circular or substantially circular shape or a triangular or substantially triangular shape.

Each of the fourth coil pattern 61, the second terminal 45A, and the second floating pattern 65 described above is a conductor made of a metal foil such as, for example, a copper foil.

Figure 7:
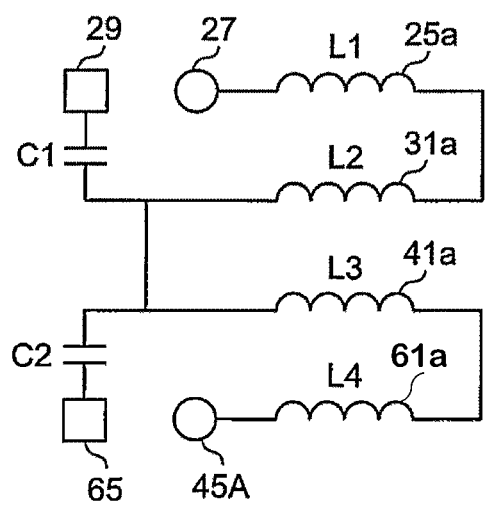
FIG. 7 is a circuit diagram of the multilayer board of Preferred Embodiment 2 of the present invention.
Figure 8:
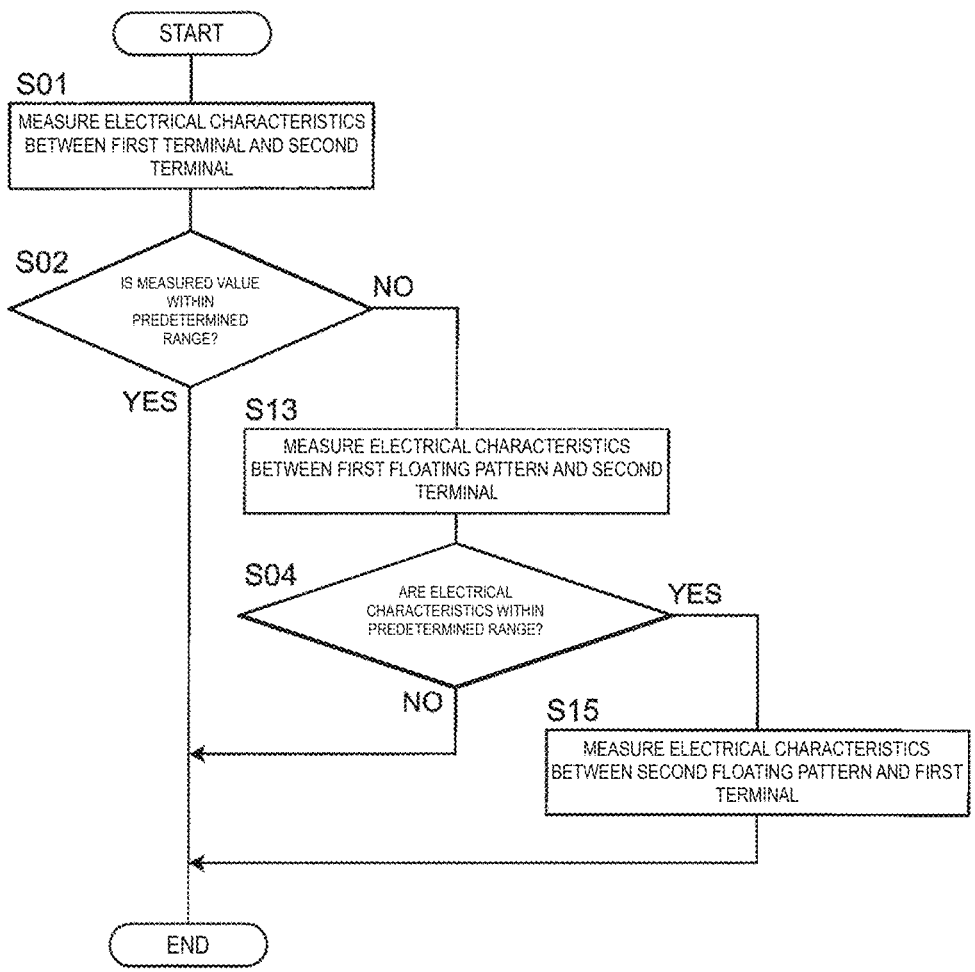
FIG. 8 is a flowchart showing a flow of a method of inspecting the multilayer board of Preferred Embodiment 2 of the present invention.

Next, with reference to FIG. 7, the circuit of the multilayer board 1A is described. FIG. 7 is a circuit diagram of the multilayer board 1A of Preferred Embodiment 2. An inductance L of the multilayer board 1A, that is, the inductance L occurring between the first terminal 27 and the second terminal 45A, has a predetermined value La, which is a value of inductance when no circuit failure is present. With the use of the inductances L1 to L3 and an inductance L4 of the fourth coil pattern 61, the predetermined value can be represented as Lb=L1+L2+L3+L4. Also, the capacitive component C2 between the second floating pattern 65 and the third extending portion 41b of the third coil pattern 41 is connected as branched between the inductances L2 and L3.
Inspection Method Next, a non-limiting example of a method of inspecting the multilayer board 1A is described with reference to FIG. 7 and FIG. 8. FIG. 8 is a flowchart showing a flow of the method of inspecting the multilayer board 1A of Preferred Embodiment 2.

Step S01 and step S02 are the same as or similar to those in the inspection method of Preferred Embodiment 1. At step S02, when the measured value is not within the predetermined range (No at step S02), it can be determined that a short-circuit failure or breaking failure has occurred in any of the first coil pattern 25 to the fourth coil pattern 61.

In this case, at step S13, electrical characteristics between the first floating pattern 29 and the second terminal 45A are measured. Between the first floating pattern 29 and the second terminal 45A, the capacitive component C1 and the inductances L3 and L4 are present. As electrical characteristics, for example, LC resonant frequencies of these are measured. At step S04, it is determined whether the measured value is within a predetermined range.

When the measured value indicating electrical characteristics is within the predetermined range (Yes at step S04), it can be determined that no failure has occurred in the third coil pattern 41 of the third insulator layer 7 and the fourth coil pattern 61 of the fourth insulator layer 9. Therefore, in this case, it can be determined that a failure has occurred in the first coil pattern 25 of the first insulator layer 3 or the second coil pattern 31 of the second insulator layer 5. At step S15, by measuring electrical characteristics between the second floating pattern 65 and the first terminal 27, it can be confirmed that a failure has occurred in the first coil pattern 25 of the first insulator layer 3 or the second coil pattern 31 of the second insulator layer 5. Between the second floating pattern 65 and the first terminal 27, the capacitive component C2 and the inductances L2 and L1 are present. As electrical characteristics, for example, by measuring LC resonant frequencies of these, it can be confirmed that a failure has occurred in the first coil pattern 25 or the second coil pattern 31.

Also at step S04, when the measured value is, for example, f2, which is outside of the allowable range from f1 as the theoretical value, that is, when the electrical characteristics are not within the predetermined range (No at step S04), it can be determined that a failure has occurred in either of the first coil pattern 25 of the first insulator layer 3 and the second coil pattern 31 of the second insulator layer 5.

In this manner, if a failure has occurred in the inspection regarding the electrical characteristics of the multilayer board 1A, it can be detected on which coil pattern provided on the first insulator layer 3 and the second insulator layer 5 or provided on the third insulator layer 7 and the fourth insulator layer 9 the failure has occurred among the four insulator layers.

Preferred Embodiment 3

Figure 9:
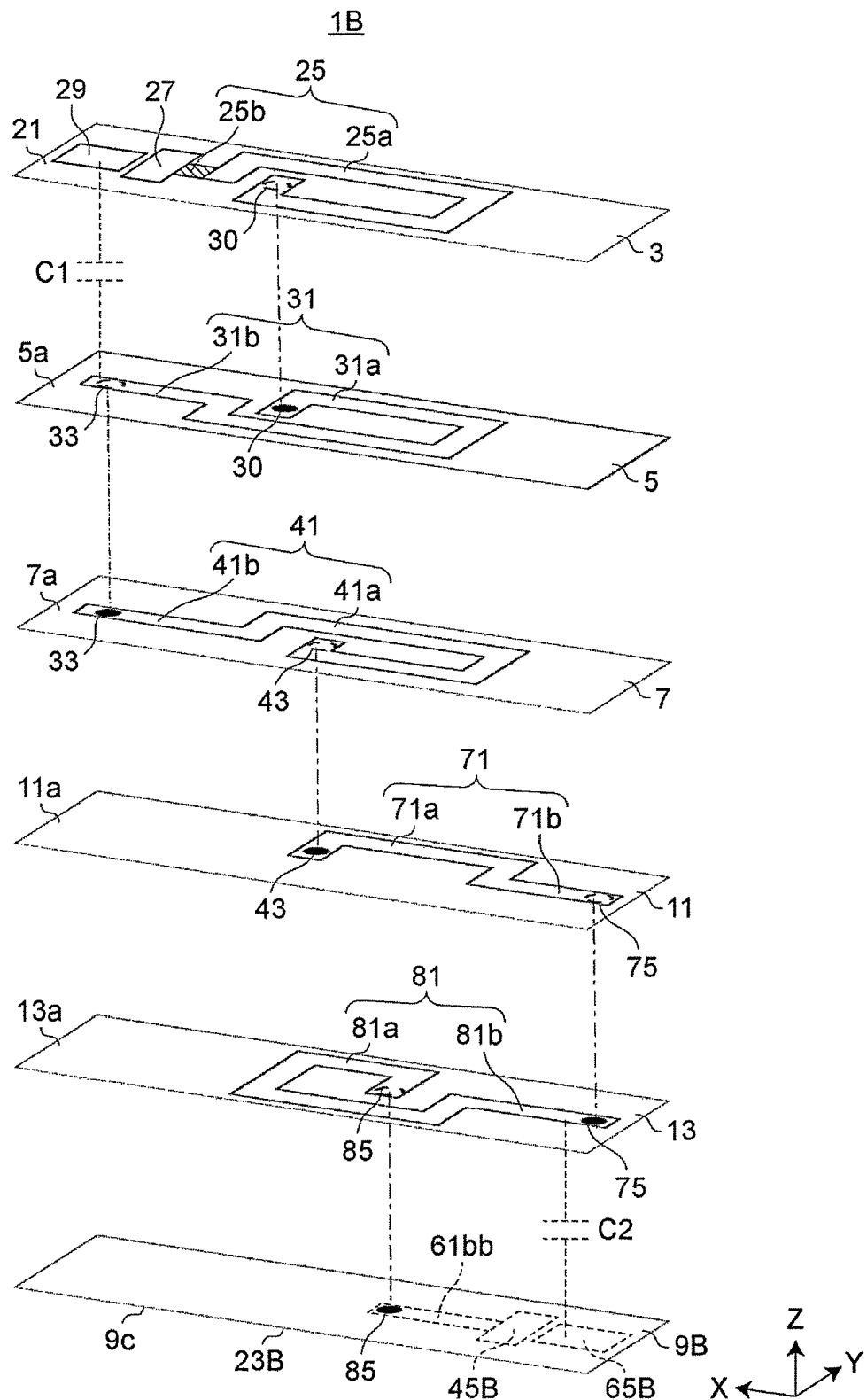
FIG. 9 is an exploded perspective view showing a multilayer board according to Preferred Embodiment 3 of the present invention.

Next, a multilayer board according to Preferred Embodiment 3 of the present invention is described with reference to FIG. 9. FIG. 9 is a diagram showing the structure of a multilayer board 1B of Preferred Embodiment 3.

The multilayer board 1B of Preferred Embodiment 3 includes two layers each including a conductor pattern provided thereon being added between the third layer and the fourth layer of the multilayer board 1A of Preferred Embodiment 2. Also, two capacitive components C1 and C2 between insulator layers are provided on different sides with respect to the respective coil portions when viewed from the laminating direction. Note that the structure of the multilayer board 1B in Preferred Embodiment 3 other than matters described below is common to that of the multilayer board 1A of Preferred Embodiment 2.

From the third insulator layer 7 towards a second principal surface 23B, a fifth insulator layer 11, a sixth insulator layer 13, and a fourth insulator layer 9B are laminated in this sequence.

On a front surface 11a defining a first principal surface 21 side of the fifth insulator layer 11, a fifth coil pattern 71 is provided. The fifth coil pattern 71 includes a fifth coil portion 71a having a semi-loop shape and a fifth extending portion 71b extending from one end of the fifth coil portion 71a outward in the longitudinal direction (X direction) of the fifth insulator layer 11. Here, the wiring pattern provided on the insulator layer includes an inductance in spite of not having a complete loop shape as that of the fifth coil pattern 71, and is therefore referred to as a coil pattern.

The other end of the fifth coil pattern 71, that is, the other end of the fifth coil portion 71a, is connected to the third interlayer connection conductor 43 connected to the third coil pattern 41 provided on the third insulator layer 7.

One end of the fifth coil pattern 71, that is, an end portion of the fifth extending portion 71b, is connected to a fourth interlayer connection conductor 75 connected to a sixth coil pattern 81 provided on the sixth insulator layer 13.

On a front surface 13a defining a first principal surface 21 side of the sixth insulator layer 13, the sixth coil pattern 81, which is a conductor pattern, is provided. The sixth coil pattern 81 includes a sixth coil portion 81a having a loop shape and a sixth extending portion 81b extending from one end of the sixth coil portion 81a outward in the longitudinal direction (X direction) of the sixth insulator layer 13.

The other end of the sixth coil pattern 81, that is, the other end of the sixth coil portion 81a, is connected to a fifth interlayer connection conductor 85 connected to a conductor pattern 61bb provided on the fourth insulator layer 9B.

On the back surface 9c defining a second principal surface 23B side of the fourth insulator layer 9B, the conductor pattern 61bb extending along the longitudinal direction (X direction) of the fourth insulator layer 9B, a second terminal 45B, and a second floating pattern 65B are provided.

The second floating pattern 65B overlaps the sixth extending portion 81b of the sixth coil pattern 81 when viewed from the laminating direction. Therefore, two conductors, that is, the second floating pattern 65B and the sixth coil pattern 81, and the sixth insulator layer 13 and the fourth insulator layer 9B interposed therebetween cause a capacitive component C2. For example, the width of the second floating pattern 65B is larger than the width of the sixth extending portion 81b of the sixth coil pattern 81, or the width of the sixth extending portion 81b of the sixth coil pattern 81 is larger than the width of the second floating pattern 65B. For example, the area of the second floating pattern 65B is larger than the area of the sixth extending portion 81b of the sixth coil pattern 81, or the area of the sixth extending portion 81b of the sixth coil pattern 81 is larger than the area of the second floating pattern 65B. With this, when viewed from the laminating direction, either one of the second floating pattern 65B and the sixth extending portion 81b can completely overlap the other, and thus the value of the capacitive component C2 can be stabilized.

Each of the fifth coil pattern 71, the sixth coil pattern 81, the conductor pattern 61bb, the second terminal 45A, and the second floating pattern 65B described above is a conductor made of a metal foil such as, for example, a copper foil.

Figure 10:
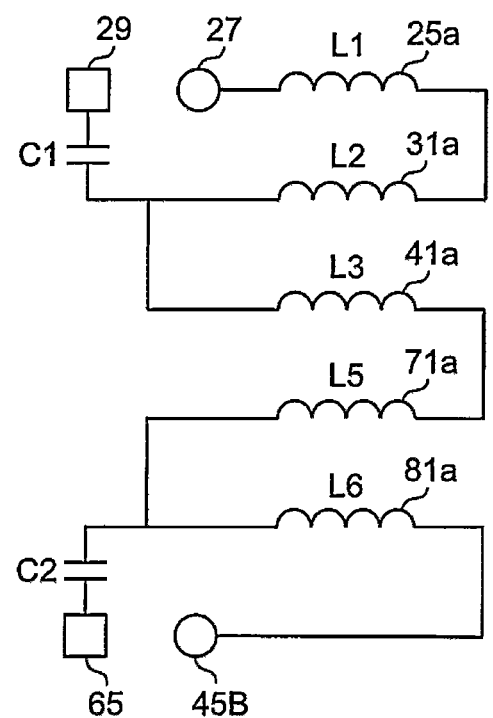
FIG. 10 is a circuit diagram of the multilayer board of Preferred Embodiment 3 of the present invention.

Next, with reference to FIG. 10, the circuit of the multilayer board 1B is described. FIG. 10 is a circuit diagram of the multilayer board 1B of Preferred Embodiment 3. An inductance L of the multilayer board 1B, that is, the inductance L occurring between the first terminal 27 and the second terminal 45B, has a predetermined value Lb, which is a value of inductance when no circuit failure is present. With the use of the inductances L1 to L3, an inductance L5 of the fifth coil pattern 71, and an inductance L6 of the sixth coil pattern 81, the predetermined value can be represented as Lb=L1+L2+L3+L5+L6. Also, the capacitive component C2 between the second floating pattern 65B and the sixth extending portion 81b of the sixth coil pattern 81 is connected as branched between the inductances L5 and L6.

Inspection Method

Figure 11:
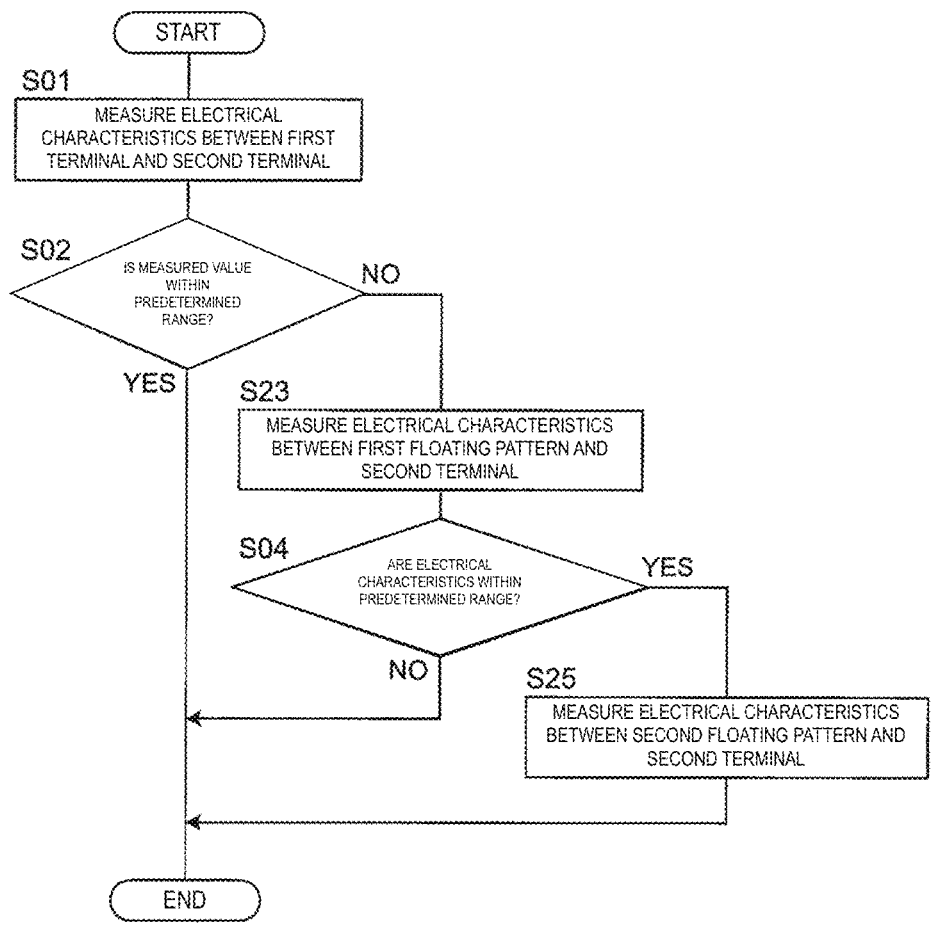
FIG. 11 is a flowchart showing a flow of a method of inspecting the multilayer board of Preferred Embodiment 3 of the present invention.

Next, a non-limiting example of a method of inspecting the multilayer board 1B is described with reference to FIG. 10 and FIG. 11. FIG. 11 is a flowchart showing a flow of the method of inspecting the multilayer board 1B of Preferred Embodiment 3.

Step S01 and step S02 are the same as or similar to those in the inspection method of Preferred Embodiment 1. At step S02, when the measured value is not within the predetermined range (No at step S02), it can be determined that a short-circuit failure, breaking failure, or failure in the L value has occurred in any of the first coil pattern 25 to the sixth coil pattern 81.

In this case, at step S23, electrical characteristics between the first floating pattern 29 and the second terminal 45B are measured. Between the first floating pattern 29 and the second terminal 45B, the capacitive component C1 and the inductances L3, L5, and L6 are present. As electrical characteristics, for example, LC resonant frequencies of these are measured. At step S04, it is determined whether the measured value is within a predetermined range.

When the measured value indicating electrical characteristics is within the predetermined range (Yes at step S04), it can be determined that no failure has occurred in the third coil pattern 41 of the third insulator layer 7, the fifth coil pattern 71 of the fifth insulator layer 11, and the sixth coil pattern 81 of the sixth insulator layer 13. Therefore, in this case, it can be determined that a failure has occurred in the first coil pattern 25 of the first insulator layer 3 or the second coil pattern 31 of the second insulator layer 5. At step S25, by measuring electrical characteristics between the second floating pattern 65 and the second terminal 45B, it can be confirmed that a failure has occurred in either of the third coil pattern 41 of the third insulator layer 7 and the fifth coil pattern 71 of the fifth insulator layer 11, and the sixth coil pattern 81 of the sixth insulator layer 13. Between the second floating pattern 65 and the second terminal 45B, the capacitive component C2 and the inductance L6 are present. As electrical characteristics, for example, by measuring LC resonant frequencies of these, it can be confirmed that a failure has occurred in either of the third coil pattern 41 of the third insulator layer 7 and the fifth coil pattern 71 of the fifth insulator layer 11, and the sixth coil pattern 81 of the sixth insulator layer 13.

Also at step S04, when the measured value is, for example, f2, which is outside of the allowable range from f1 as the theoretical value, that is, when the electrical characteristics are not within the predetermined range (No at step S04), it can be determined that a failure has occurred in either of the first coil pattern 25 of the first insulator layer 3 and the second coil pattern 31 of the second insulator layer 5.

In this manner, if a failure has occurred in the inspection regarding the electrical characteristics of the multilayer board 1B, it can be detected on which coil pattern formed on the first insulator layer 3 and the second insulator layer 5, formed on the third insulator layer 7 and the fifth insulator layer 11, or formed on the sixth insulator layer 13 and the fourth insulator layer 9 the failure has occurred among the six insulator layers. Therefore, it can be generally understood on which insulator layer a failure has occurred, and thus the number of man-hours for measurement can be reduced.

While the present invention has been described with reference to the above-described preferred embodiments, the present invention is not limited to the above-described preferred embodiments.

In Preferred Embodiment 1 described above, the multilayer board 1 including one floating pattern has, for example, a three-layer structure, but is not limited thereto. For example, the multilayer board 1 including one floating pattern may further include another insulator layer including a coil pattern provided thereon between the first insulator layer 3 and the second insulator layer 5 or between the second insulator layer 5 and the third insulator layer 7. Therefore, the multilayer board may have, for example, a four-layer structure including one floating pattern. Also, each coil pattern is not limited to a single-turn loop, and may have a plural-turn loop shape.

Figure 12A:
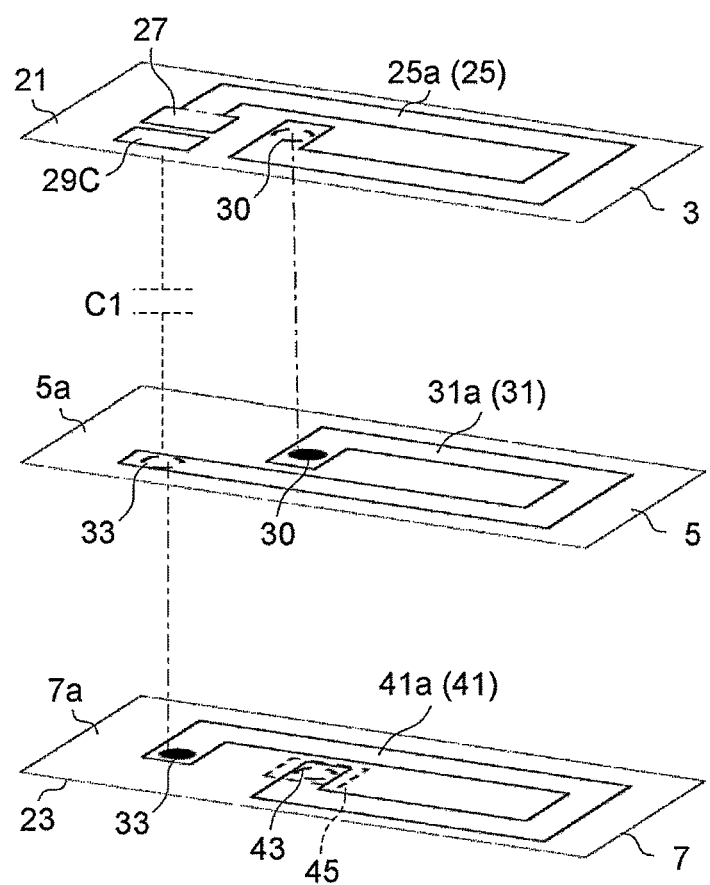
FIG. 12A is an exploded perspective view showing a multilayer board of a modification of Preferred Embodiment 1 of the present invention.
Figure 12A:
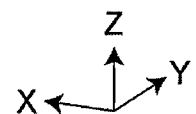

In Preferred Embodiment 1 described above, the multilayer board 1 includes the extending portion extending from each coil pattern, but is not limited thereto. For example, as shown in FIG. 12A, in a multilayer board 1C, the first insulator layer 3 to the third insulator layer 7 do not include extending portions extending from the coil portions 25a, 31a, and 41a, respectively, of the coil patterns. A first floating pattern 29C is provided on an extension in a winding direction of the first coil portion 25a or along the winding direction. This allows a floating pattern to be provided without increasing the outer shape of the coil pattern, and thus the size of the multilayer board 1 can be decreased. Since the first floating pattern 29C is opposed to a portion of the second coil portion 31a of the second coil pattern 31 of the second insulator layer 5 in the laminating direction, a capacitive component C1 occurs.

Figure 12B:
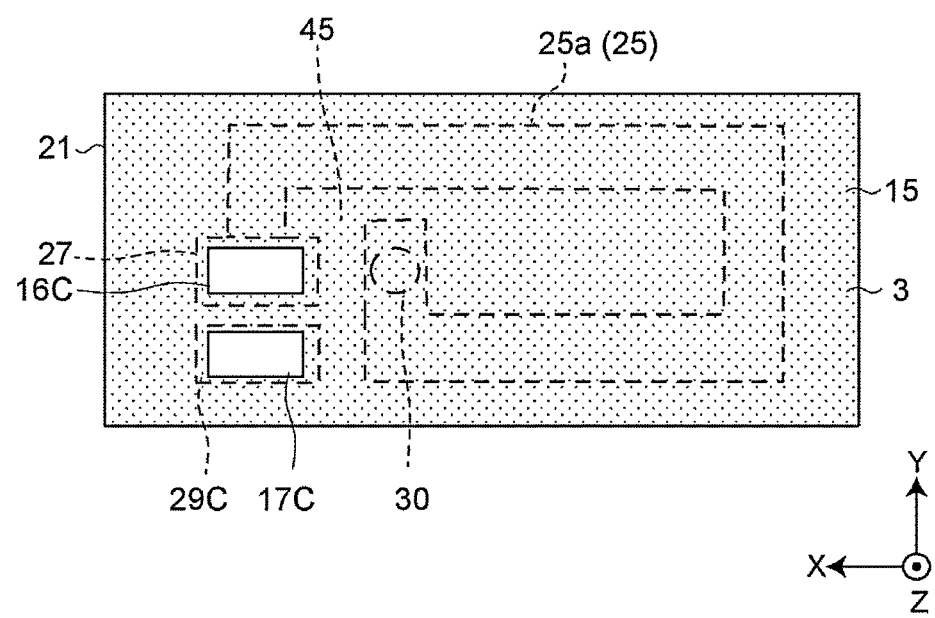
FIG. 12B is a bottom view of a second principal surface of the multilayer board of the modification of Preferred Embodiment 1 of the present invention.

In the multilayer board 1C, as shown in FIG. 12B, as with Preferred Embodiment 1, the protective film 15 is laminated on the front surface of the first principal surface 21 side of the first insulator layer 3. Therefore, the first coil pattern 25 is covered with the protective film 15. On the first terminal 27 and the first floating pattern 29C, cavities 16C and 17C are respectively provided, from which a portion of regions of the first terminal 27 and the first floating pattern 29C are respectively exposed externally. The other regions of the first terminal 27 and the first floating pattern 29C are each covered with the protective film 15.

Also, in each of the preferred embodiments described above, the first extending portion 25b of the first coil pattern 25 and the second extending portion 31b of the second coil pattern 31 may be shifted in a width direction (Y-axis direction) of the multilayer board 1 when viewed from the laminating direction. In this case, the first floating pattern 29 may extend along the first coil pattern 25. With the first floating pattern 29 and the second extending portion 31b overlapping each other when viewed from the laminating direction, the advantageous effects of the respective preferred embodiments can be obtained even if the first extending portion 25b and the second extending portion 31b do not overlap each other.

Figure 15A:
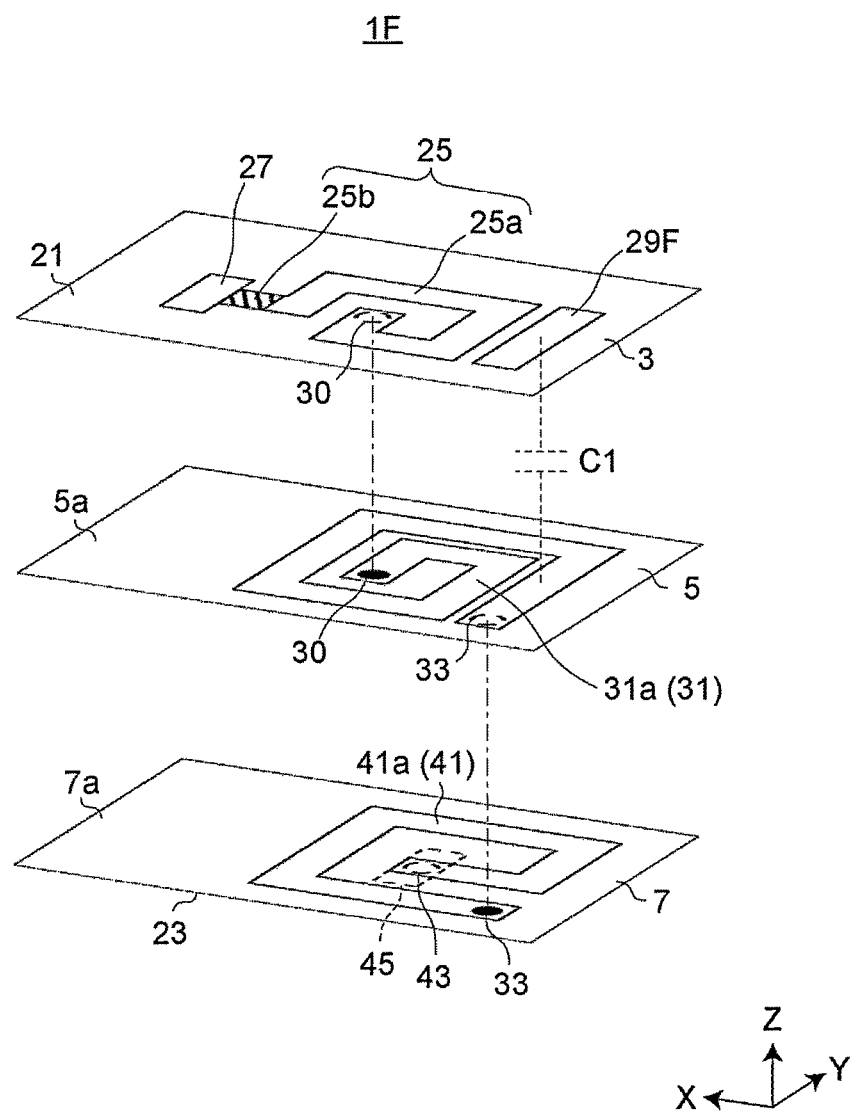
FIG. 15A is an exploded perspective view showing a multilayer board of a modification of Preferred Embodiment 1 of the present invention.

For example, in a multilayer board 1F shown in FIG. 15A, the first coil pattern 25 may be provided between a first floating pattern 29F and the first terminal 27. The first floating pattern 29F extends along the first coil portion 25a of the first coil pattern 25. The second coil pattern 31 provided on the second insulator layer 5 and the third coil pattern 41 provided on the third insulator layer 7 each do not include an extending portion extending from the coil portion. Since the first floating pattern 29F is opposed to a portion of the second coil portion 31a of the second coil pattern 31 provided on the second insulator layer 5 in the laminating direction, a capacitive component C1 occurs.

Figure 15B:
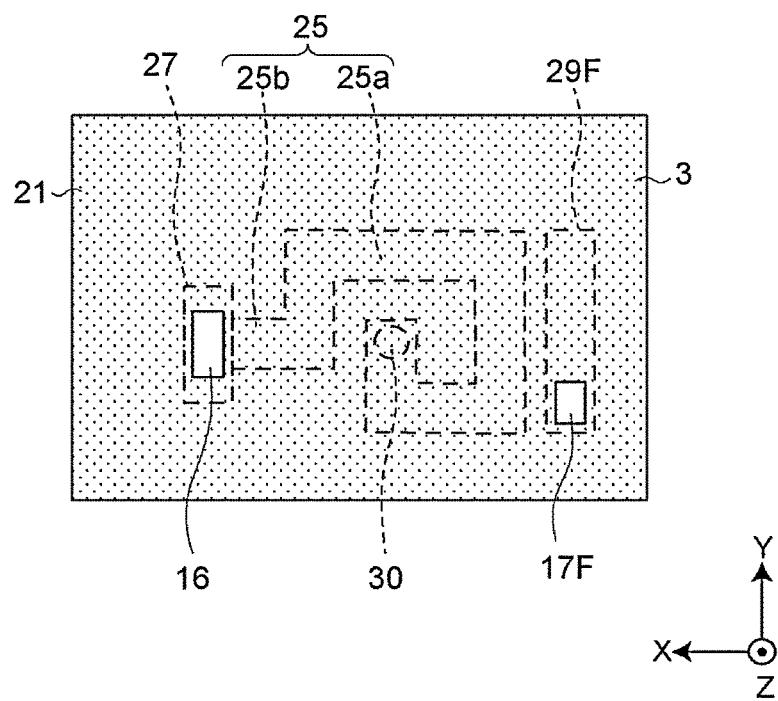
FIG. 15B is a bottom view of a second principal surface of the multilayer board of the modification of Preferred Embodiment 1 of the present invention.

In the multilayer board 1F, as shown in FIG. 15B, as with Preferred Embodiment 1, the protective film 15 is laminated on the front surface of the first principal surface 21 side of the first insulator layer 3. Therefore, the first coil pattern 25 is covered with the protective film 15. On the first terminal 27 and the first floating pattern 29F, cavities 16 and 17F are respectively provided, from which a portion of regions of the first terminal 27 and the first floating pattern 29F are respectively exposed externally. The other regions of the first terminal 27 and the first floating pattern 29F are each covered with the protective film 15. When the area of the floating pattern is large as in this case, the cavity 17F may be arranged so as to externally expose only a portion required for measurement by the probe.

Also, the extending portion extending from the coil portion of each coil pattern may extend along the pattern of the coil portion, and the first terminal 27 and the second terminal 45, 45A may extend along the outer periphery of the coil pattern. Also in this case, the first floating pattern 29 may extend along the first coil pattern 25. With this, when the respective insulator layers are collectively formed by heating, the first floating pattern 29 can reduce or prevent a pattern deviation of the first coil pattern 25.

Figure 13A:
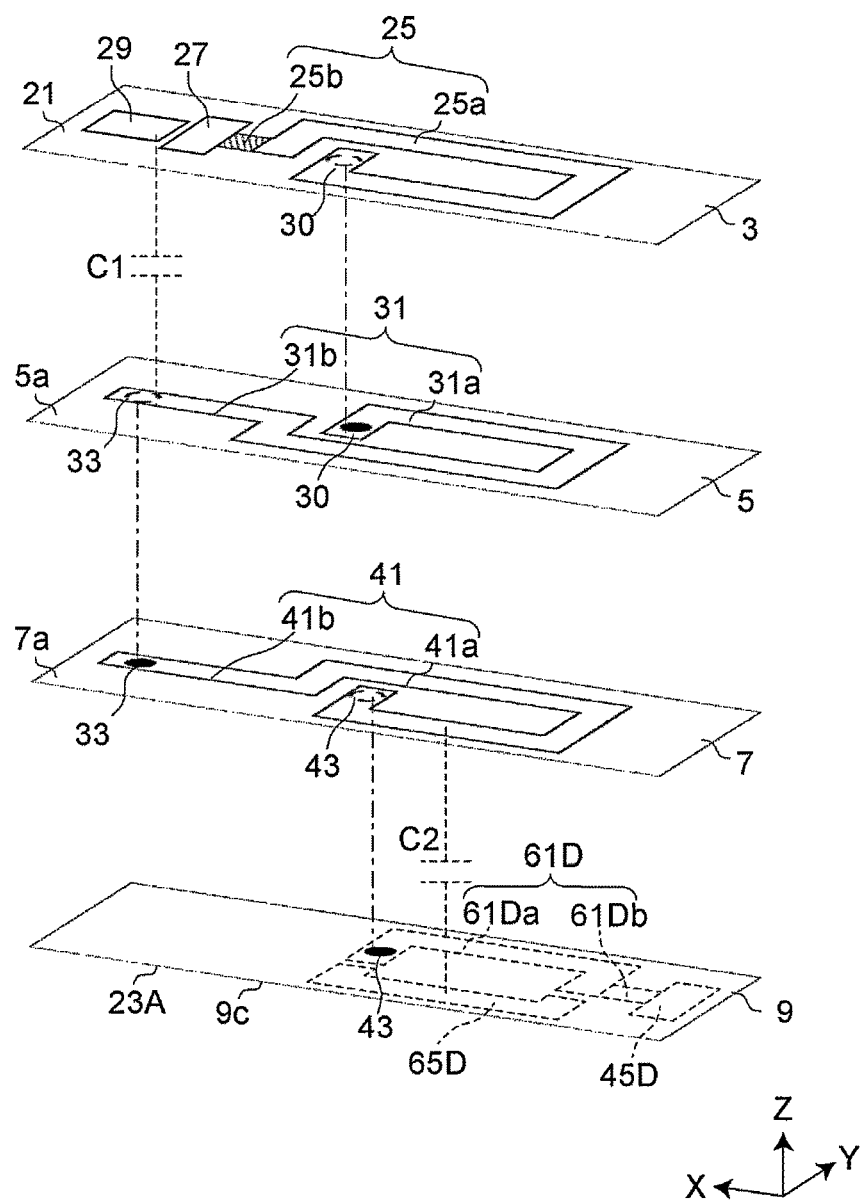
FIG. 13A is an exploded perspective view showing a multilayer board of a modification of Preferred Embodiment 2 of the present invention.

In Preferred Embodiment 2 described above, the first terminal 27 provided on the first insulator layer 3 and the second terminal 45A provided on the fourth insulator layer 9 are provided on the same side in the multilayer board 1A, but is not limited thereto. The first terminal 27 and the second terminal 45A may be provided on different sides in the multilayer board 1A. For example, as shown in FIG. 13A, in a multilayer board 1D, the first terminal 27 and a second terminal 45D are provided so that the first interlayer connection conductor 30 is positioned between the first terminal 27 and the second terminal 45D in plan view.

Also, a fourth coil pattern 61D provided on the back surface 9c of the fourth insulator layer 9 includes a fourth coil portion 61Da having a semi-loop shape and a fourth extending portion 61Db extending from one end of the fourth coil portion 61Da outward in the longitudinal direction (X direction) of the fourth insulator layer 9. A second floating pattern 65D provided on the back surface 9c of the fourth insulator layer 9 has a semi-loop shape, and is opposed to the fourth coil portion 61Da on the fourth insulator layer 9. Since the second floating pattern 65D is opposed to a portion of the third coil portion 41a of the third insulator layer 7 in the laminating direction, a capacitive component C2 occurs. With the second floating pattern 65D, the third coil portion 41a of the third coil pattern 41 of the third insulator layer 7 can be further finely and partially inspected.

Figure 13B:
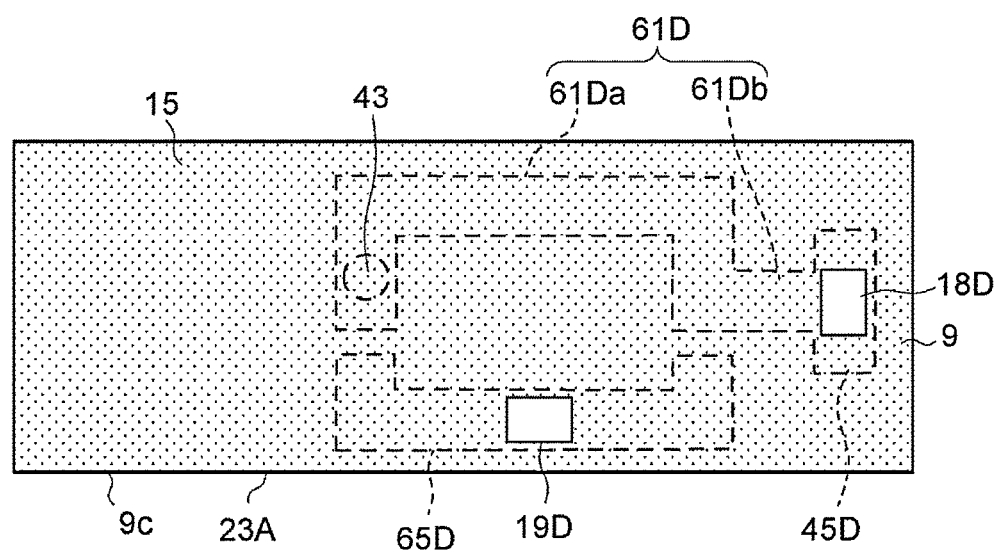
FIG. 13B is a bottom view of a second principal surface of the multilayer board of the modification of Preferred Embodiment 2 of the present invention.

In the multilayer board 1D, as shown in FIG. 13B, the protective film 15 is laminated on the back surface 9c of the second principal surface 23A side of the fourth insulator layer 9. Therefore, the fourth coil pattern 61D is covered with the protective film 15. On the second terminal 45D and the second floating pattern 65D, cavities 18D and 19D are respectively provided, from which a portion of regions of the second terminal 45D and the second floating pattern 65D are respectively exposed externally. The other regions of the second terminal 45D and the second floating pattern 65D are each covered with the protective film 15. Through the cavities 18D and 19D, the measurement probe can make contact with the second terminal 45D and the second floating pattern 65D.

Figure 14:
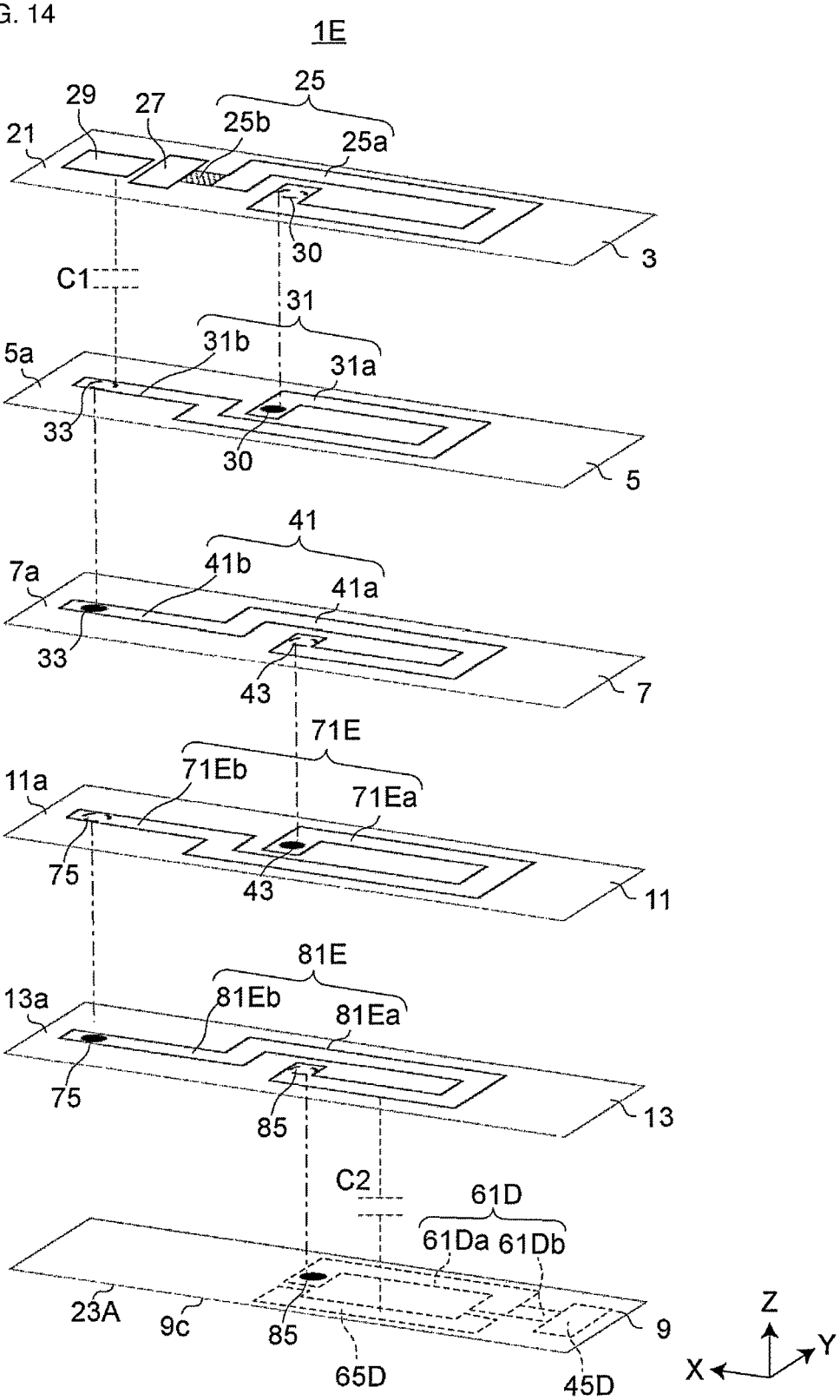
FIG. 14 is an exploded perspective view showing a multilayer board of a modification of Preferred Embodiment 3 of the present invention.

In Preferred Embodiment 3 described above, the multilayer board 1B includes the fifth insulator layer 11 including the fifth coil pattern 71 provided thereon, the fifth coil pattern 71 having a semi-loop shape, but is not limited thereto. As shown in FIG. 14, in a multilayer board 1E, a fifth coil pattern 71E provided on the fifth insulator layer 11 may have a shape the same as or similar to that of the second coil pattern 31 provided on the second insulator layer 5. A fifth coil portion 71Ea has a shape the same as or similar to that of the second coil portion 31a, and a fifth extending portion 71Eb has a shape the same as or similar to that of the second extending portion 31b. Also, a sixth coil pattern 81E provided on the sixth insulator layer 13 may have a shape the same as or similar to that of the third coil pattern 41. A sixth coil portion 81Ea has a shape the same as or similar to that of the third coil portion 41a, and a sixth extending portion 81Eb has a shape the same as or similar to that of the third extending portion 41b. Also, on the back surface 9c side of the fourth insulator layer 9 as the lowermost layer, the fourth coil pattern 61D and the second floating pattern 65D are provided. Since the second floating pattern 65D is opposed to a portion of the sixth coil portion 81Ea provided on the sixth insulator layer 13 in the laminating direction, a capacitive component C2 occurs. Since the second floating pattern 65D having a shape as described above is provided on the fourth insulator layer 9, the sixth coil portion 81Ea of the sixth coil pattern 81E of the sixth insulator layer 13 as a fifth layer can be further finely and partially inspected.

Figure 16:
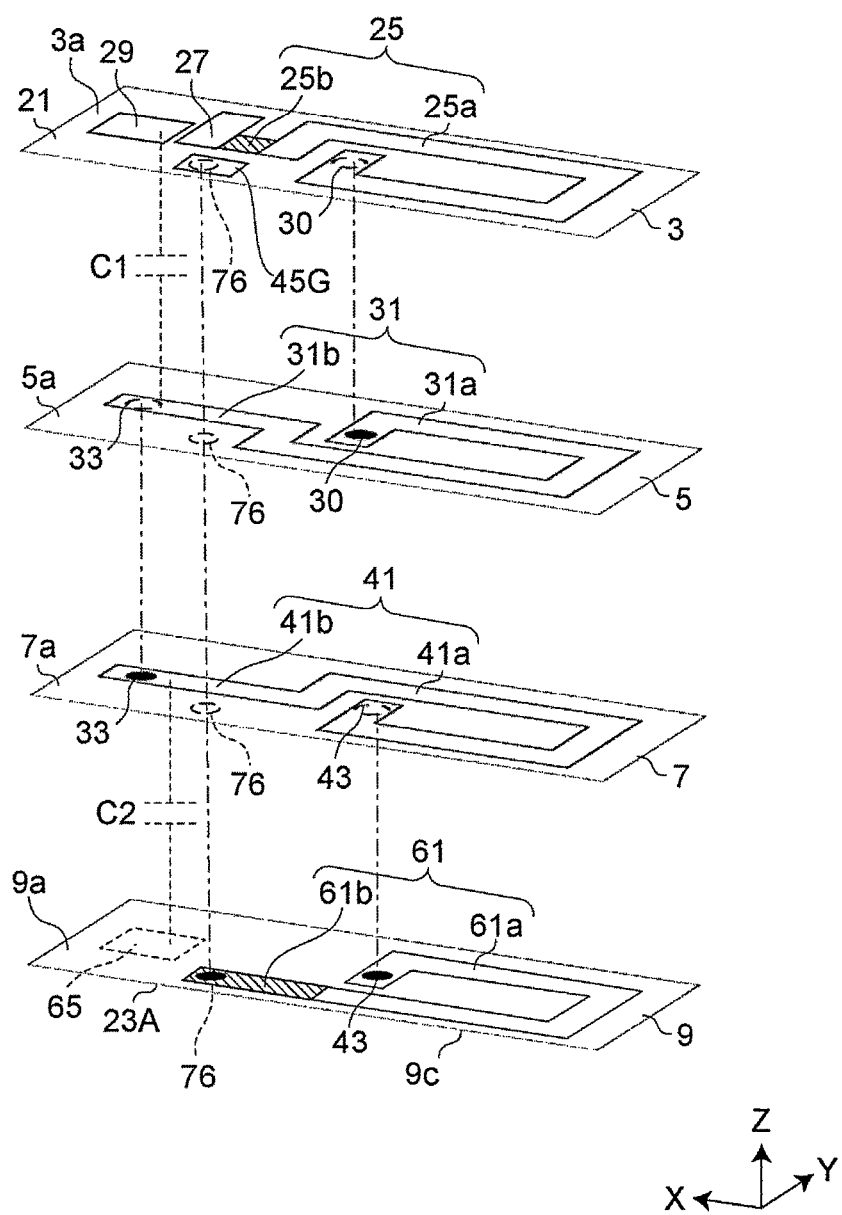
FIG. 16 is an exploded perspective view showing a multilayer board of a modification of Preferred Embodiment 2 of the present invention.

In the preferred embodiments described above, the second terminal is provided on the lowermost insulator layer, but is not limited thereto. For example, as shown in FIG. 16, in a multilayer board 1G, a second terminal 45G is provided on the first insulator layer 3 as the uppermost layer. The multilayer board 1G is described below as a modification of Preferred Embodiment 2.

The multilayer board 1G includes the fourth coil pattern 61 provided on a front surface 9a side defining and functioning as a first principal surface 21 side of the fourth insulator layer 9. The fourth coil pattern 61 includes the fourth coil portion 61a having a loop shape and the fourth extending portion 61b extending from one end of the fourth coil portion 61a outward in the longitudinal direction (X direction) of the fourth insulator layer 9. Also, the second floating pattern 65 is provided on the back surface 9c side of the fourth insulator layer 9.

On a front surface 3a side defining and functioning as a first principal surface 21 side of the first insulator layer 3, the second terminal 45G interlayer-connected to one end of the fourth coil pattern 61, that is, an end portion of the fourth extending portion 61b, is provided. The one end of the fourth coil pattern 61, that is, the end portion of the fourth extending portion 61b, is connected, via a fourth interlayer connection conductor 76 provided in the first insulator layer 3, the second insulator layer 5, and the third insulator layer 7, to the second terminal 45G provided on the front surface 3a of the first insulator layer 3. The fourth interlayer connection conductor 76 penetrates through each of the first insulator layer 3, the second insulator layer 5, and the third insulator layer 7 to connect the second terminal 45G and the end portion of the fourth extending portion 61b.

With this structure, since the first terminal 27 and the second terminal 45G are provided on a single surface of the multilayer board 1G, even if the other surface of the multilayer board 1G is physically filled due to the arrangement of other members and so forth, inputs and outputs of electrical signals can be defined by the first terminal 27 and the second terminal 45G. Also, a measurement by the probe between the first terminal 27 and the second terminal 45G can be facilitated.

While the present invention has been sufficiently described regarding preferable preferred embodiments with reference to the accompanying drawings, various modifications and revisions are evident for people skilled in the art. These modifications and revisions should be understood as being included in the scope of the present disclosure based on the accompanying claims as long as they do not depart from the scope of the present invention. Also, combinations and changes in sequence of the components in each preferred embodiment can be provided without deviating from the scope and idea of the present invention.

Preferred embodiments of the present invention are applicable to a multilayer board, electronic device including the multilayer board, and multilayer board inspection method.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
   a first insulator layer including a first coil pattern thereon;
   a second insulator layer including a second coil pattern thereon;
   a third insulator layer including a third coil pattern thereon;
   a first terminal on the first insulator layer and connected to one end of the first coil pattern;
   a first floating pattern on the first insulator layer and not connected to the first coil pattern; and
   a second terminal electrically connected to one end of the third coil pattern; wherein
   the first insulator layer, the second insulator layer, and the third insulator layer are sequentially laminated;
   the first coil pattern, the second coil pattern, and the third coil pattern are respectively electrically connected in sequence; and
   the first floating pattern overlaps the second coil pattern when viewed from a laminating direction.

2. The multilayer board according to claim 1, wherein the second coil pattern includes a coil portion having in a loop shape and an extending portion extending outward from the coil portion of the second coil pattern; and
   the first floating pattern overlaps the coil portion of the second coil pattern when viewed from the laminating direction.

3. The multilayer board according to claim 1, wherein the second terminal is on the third insulator layer.

4. The multilayer board according to claim 1, wherein
   the first coil pattern includes a coil portion having a loop shape and an extending portion extending outward from the coil portion of the first coil pattern;
   an end portion of the extending portion of the first coil pattern is connected to the first terminal; and
   the first floating pattern is opposed to an extending direction of the extending portion of the first coil pattern.

5. The multilayer board according to claim 1, wherein the first floating pattern is adjacent to or in a vicinity of the first terminal.

6. An electronic device to which the multilayer board according to claim 1 is attached, wherein the first floating pattern is not connected to a power supply of the electronic device.

7. The multilayer board according to claim 1, wherein
   the second coil pattern includes a coil portion having a loop shape and an extending portion extending outward from the coil portion of the second coil pattern; and
   the first floating pattern overlaps the extending portion of the second coil pattern when viewed from the laminating direction.

8. The multilayer board according to claim 7, wherein an area of the first floating pattern is larger than an area of the extending portion of the second coil pattern.

9. The multilayer board according to claim 7, wherein an area of the extending portion of the second coil pattern is larger than an area of the first floating pattern.

10. The multilayer board according to claim 7, wherein the extending portion of the second coil pattern is connected to an interlayer connection conductor to connect to the third coil pattern.

11. The multilayer board according to claim 1, wherein the first floating pattern extends along a shape of the first coil pattern.

12. The multilayer board according to claim 11, wherein the first floating pattern extends along the coil portion of the first coil pattern.

13. The multilayer board according to claim 1, further comprising:
    a fourth insulator layer laminated with respect to the third insulator layer oppositely to the second insulator layer and including a conductor pattern thereon; wherein
    the second terminal is on the fourth insulator layer and is connected via the conductor pattern to the third coil pattern.

14. The multilayer board according to claim 13, further comprising:
    a second floating pattern on the fourth insulator layer and not connected to the conductor pattern; wherein
    the second floating pattern overlaps the third coil pattern when viewed from the laminating direction.

15. The multilayer board according to claim 14, wherein
    the third coil pattern includes a coil portion having a loop shape and an extending portion extending outward from the coil portion of the third coil pattern; and
    the second floating pattern overlaps the extending portion of the third coil pattern when viewed from the laminating direction.

16. The multilayer board according to claim 15, wherein an area of an extending portion of the third coil pattern is larger than an area of the second floating pattern.

17. The multilayer board according to claim 15, wherein an area of the second floating pattern is larger than an area of an extending portion of the third coil pattern.

18. The multilayer board according to claim 15, wherein the extending portion of the third coil pattern is connected to an interlayer connection conductor to connect to the second coil pattern.

19. The multilayer board according to claim 14, wherein
the conductor pattern includes a coil portion having a loop shape and an extending portion extending outward from the coil portion of the conductor pattern;
an end portion of the extending portion of the conductor pattern is connected to the second terminal; and
the second floating pattern extends in an extending direction of the extending portion of the conductor pattern.

20. The multilayer board according to claim 14, wherein the second floating pattern is adjacent to or in a vicinity of the second terminal.

21. The multilayer board according to claim 14, further comprising:
a fifth insulator layer including a conductor pattern thereon and a sixth insulator layer including a sixth coil pattern thereon, between the third insulator layer and the fourth insulator layer; wherein
the fifth insulator layer and the sixth insulator layer are sequentially laminated from a side closer to the third insulator layer than to the first insulator layer; and
the third coil pattern, the conductor pattern of the fifth insulator layer, the sixth coil pattern, and the conductor pattern of the fourth insulator layer are connected.

* * * * *